(12) United States Patent
Hanada et al.

(10) Patent No.: US 12,379,638 B2
(45) Date of Patent: Aug. 5, 2025

(54) DISPLAY DEVICE AND SEMICONDUCTOR DEVICE

(71) Applicant: Japan Display Inc., Tokyo (JP)

(72) Inventors: Akihiro Hanada, Tokyo (JP); Toshihide Jinnai, Tokyo (JP); Isao Suzumura, Tokyo (JP); Hajime Watakabe, Tokyo (JP); Ryo Onodera, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 18/777,958

(22) Filed: Jul. 19, 2024

(65) Prior Publication Data

US 2024/0369891 A1 Nov. 7, 2024

Related U.S. Application Data

(63) Continuation of application No. 18/503,351, filed on Nov. 7, 2023, now Pat. No. 12,072,595, which is a
(Continued)

(30) Foreign Application Priority Data

Mar. 11, 2019 (JP) ................................. 2019-043407

(51) Int. Cl.
*H10K 59/131* (2023.01)
*G02F 1/1362* (2006.01)
(Continued)

(52) U.S. Cl.
CPC ...... *G02F 1/1368* (2013.01); *G02F 1/136209* (2013.01); *G02F 1/136277* (2013.01);
(Continued)

(58) Field of Classification Search
CPC ............. H10K 59/131; H10K 59/8792; H10K 50/865; G02F 1/136209; H10D 30/6745; H10D 30/6723
(Continued)

(56) References Cited

U.S. PATENT DOCUMENTS 6,518,944 B1 2/2003 Doane et al.
11,630,361 B2 4/2023 Hanada et al.
(Continued)

FOREIGN PATENT DOCUMENTS

| JP | 2016-194703 A | 11/2016 |
|---|---|---|
| JP | 2017-208473 A | 11/2017 |
| JP | 2017-536646 A | 12/2017 |

OTHER PUBLICATIONS

International Search Report issued on Jun. 16, 2020, in corresponding International Application No. PCT/JP2020/010151, 2 pages.

*Primary Examiner* — Christopher M Raabe
(74) *Attorney, Agent, or Firm* — Maier & Maier, PLLC

(57) ABSTRACT

A display device including: a substrate; a first thin film transistor of polysilicon semiconductor, a second thin film transistor of oxide semiconductor; a first light shading film opposing to the polysilicon semiconductor, and a second light shading film opposing to the oxide semiconductor; a first insulating film, a second insulating film which is constituted from plural insulating films, and a third insulating film superposed in this order; a first through hole penetrating the second insulating film and not penetrating the first insulating film and the third insulating film; a second through hole penetrating the first insulating film and the third insulating film; the first light shading film connects with a first conductive component, a part of the first conductive component exists on the third insulating film, through the second through hole.

20 Claims, 24 Drawing Sheets

Related U.S. Application Data continuation of application No. 18/164,809, filed on Feb. 6, 2023, now Pat. No. 11,846,860, which is a continuation of application No. 17/471,881, filed on Sep. 10, 2021, now Pat. No. 11,630,361, which is a continuation of application No. PCT/JP2020/010151, filed on Mar. 10, 2020.

(51) Int. Cl.
*G02F 1/1368* (2006.01)
*H10D 30/67* (2025.01)
*H10K 50/86* (2023.01)
*H10K 59/80* (2023.01)

(52) U.S. Cl.
CPC ... *G02F 1/136286* (2013.01); *H10D 30/6723* (2025.01); *H10D 30/6745* (2025.01); *H10K 50/865* (2023.02); *H10K 59/131* (2023.02); *H10K 59/8792* (2023.02)

(58) Field of Classification Search
USPC .......................................................... 349/56
See application file for complete search history.

(56) References Cited

U.S. PATENT DOCUMENTS

| | | |
|---|---|---|
| 2003/0081158 A1 | 5/2003 | Li et al. |
| 2013/0300992 A1 | 11/2013 | Kozuka et al. |
| 2014/0131703 A1 | 5/2014 | Miyamoto et al. |
| 2016/0043149 A1 | 2/2016 | Sagardoyburu |
| 2016/0087022 A1 | 3/2016 | Tsai et al. |
| 2017/0338249 A1 | 11/2017 | Suzumura et al. |
| 2020/0020756 A1 | 1/2020 | Ueda et al. |
| 2020/0111433 A1 | 4/2020 | Kikuchi et al. |
| 2020/0218109 A1 | 7/2020 | Um et al. |
| 2021/0063831 A1 | 3/2021 | Zhang et al. |
| 2022/0165806 A1* | 5/2022 | Yun ...................... H10K 59/121 |
| 2023/0301158 A1* | 9/2023 | Jung .................. H10K 59/8792 |
| 2024/0032352 A1* | 1/2024 | Cao .................... H10K 59/8792 |
| 2024/0121983 A1* | 4/2024 | Koo ..................... H10D 30/6729 |
| 2024/0224634 A1* | 7/2024 | Zheng .................. H10K 59/126 |
| 2024/0276768 A1* | 8/2024 | Liu ..................... H10K 59/1216 |
| 2025/0024714 A1* | 1/2025 | Um ...................... H10K 59/126 |

\* cited by examiner

DISPLAY DEVICE AND SEMICONDUCTOR DEVICE

The present application is a continuation application of U.S. Application of U.S. application Ser. No. 18/503,351, filed on Nov. 7, 2023, which is a continuation application of U.S. application Ser. No. 18/164,809, filed on Feb. 6, 2023, which is a continuation application of U.S. application Ser. No. 17/471,881, filed on Sep. 10, 2021, now U.S. Pat. No. 11,630,361, issued on Apr. 18, 2023, which is a continuation application of International Application No. PCT/JP2020/010151, filed on Mar. 10, 2020, which claims priority to Japanese Patent Application No. 2019-043407, filed on Mar. 11, 2019. The contents of these applications are incorporated herein by reference in their entirety.

BACKGROUND OF THE INVENTION

(1) Field of the Invention

The present invention relates to display devices and semiconductor devices having hybrid structure, in which both TFTs of polysilicon semiconductors and TFTs of oxide semiconductors are used.

The liquid crystal display device has a structure that the TFT substrate, in which the pixels, having the pixel electrodes and the TFTs (Thin Film Transistors), are arranged in matrix, and the counter substrate, in which black matrix and so forth are formed, oppose to each other; and the liquid crystal is sandwiched between the TFT substrate and the counter substrate. The images are formed by controlling the light transmittance in the liquid crystal in each of the pixels. On the other hand, the organic EL display device has a light emitting layer in each of the pixels; the color images are formed by controlling the light emitted from each of the organic light emitting layers with the TFTs. The organic EL display device does not need a back light, thus it is advantageous for a display device to be made thinner.

The polysilicon semiconductor has high mobility, therefore, it is suitable for the TFTs for driving circuits. On the other hand, the oxide semiconductor has high OFF resistance which gives low OFF current, therefore, it is suitable for the switching TFTs in the pixels.

Patent document 1, patent document 2, and patent document 3 disclose the display device, in which both TFTs of polysilicon semiconductor (herein after polysilicon semiconductor TFTs) and TFTs of oxide semiconductor (herein after oxide semiconductor TFTs) are used. Patent document 1 discloses a configuration in which countermeasures are applied for the phenomenon that the oxide semiconductor is dissolved at the through hole when through holes are formed simultaneously for the oxide semiconductor TFTs and the polysilicon semiconductor TFTs. Patent document 2 discloses a configuration in which the number of processes is reduced by making the TFTs of oxide semiconductors as the bottom gate type TFTs in the display devices, which use both the polysilicon semiconductor TFTs and the oxide semiconductor TFTs. Patent document 3 discloses an organic EL display device which has both the polysilicon semiconductor TFT and the oxide semiconductor TFT in the pixel.

Patent document 1: Japanese patent application laid open No. 2017-208473.

Patent document 2: Japanese patent application laid open No. 2016-194703.

Patent document 3: Japanese unexamined patent application publication (translation of PCT application) No. 2017-536646.

SUMMARY OF THE INVENTION

The TFT which is used as a switching element in the pixel needs to have small leak current. The oxide semiconductor TFT can have small leak current. However, since the mobility of carrier is low in the oxide semiconductor, it is sometimes difficult to form the driving circuit installed in the display device by oxide semiconductor TFTs.

On the other hand, since the polysilicon semiconductor TFT has a high carrier mobility, the driving circuit can be formed by the polysilicon semiconductor TFTs. However, since the polysilicon semiconductor TFT has large leak current, generally two polysilicon semiconductor TFTs are used in series when the polysilicon semiconductor TFT is used as the switching element in the pixel.

Therefore, it is rational to use the oxide semiconductor TFT as the switching TFT in the pixel in the display area, and to use the polysilicon semiconductor TFT for the driving circuit formed in the peripheral area. However, the polysilicon semiconductor TFT and the oxide semiconductor TFT need to be formed on different layers from each other. Generally, due to process temperature requirement, the polysilicon semiconductor TFT is formed first, namely on the lower layer; and the oxide semiconductor TFT is formed later, namely, on the upper layer.

On the other hand, the substrate is formed from resin such as polyimide for the flexible display device. The resin is easy to charge up, consequently, the charges in the resin substrate influence the function of the TFT. It is necessary to form a metal layer between the TFT and the substrate to shield the charge in the substrate. The metal layer needs to be applied with certain voltage, e.g. common voltage, to work as a shield electrode; consequently, the through hole is necessary for application of certain voltage to the shield electrode. By the way, this metal layer has a role as the light shading film to avoid that characteristics of the TFT are influenced by light from the back light.

In addition, many through holes are necessary for wirings when polysilicon semiconductor TFTs and the oxide semiconductor TFTs are formed on the same substrate. The purpose of the present invention is to decrease the number of through holes and simplify the manufacturing process in forming the semiconductor device having complicated structure as including many TFTs.

The present invention overcomes the above described problems; the representative structure of the present invention is as follows. A display device including: a substrate; a first thin film transistor, including a polysilicon semiconductor layer, formed on the substrate; a second thin film transistor, including an oxide semiconductor layer, formed on the substrate; a first light shading film, located between the polysilicon semiconductor layer and the substrate, and opposing to the polysilicon semiconductor layer; a second light shading film located between the oxide semiconductor layer and the substrate, and opposing to the oxide semiconductor layer; a first insulating film, having at least one layer, formed on the first light shading film; a second insulating film, which is constituted from a plural insulating films, formed on the first insulating film; a third insulating film, having at least one layer, formed on the second insulating film; a first through hole, opposing to the first light shading film, penetrating each of the plural insulating films of the second insulating film, and not penetrating the first insulating film and the second insulating film; and a second through hole, opposing to the first light shading film, penetrating the first insulating film and the third insulating film, and a part of the second through hole existing in the first through hole, in which the first light shading film electrically connects with a first conductive component via the second through hole, and at least a part of the first conductive component exists on the third insulating film.

DETAILED DESCRIPTION OF THE PREFERRED EMBODIMENTS

Examples of the oxide semiconductors are indium gallium zinc oxide (IGZO), indium tin zinc oxide (ITZO), zinc oxide nitride (ZnON), indium gallium oxide (IGO), and so forth.

In the display device, generally, the polysilicon semiconductor is formed from so called LTPS (Low Temperature Poly-Si), which is transformed through annealing using excimer laser from the a-Si semiconductor, which is formed by CVD (Chemical Vapor Deposition).

In this specification, a term of hybrid structure may be used for the structure which uses both oxide semiconductor TFTs and the polysilicon semiconductor TFTs. In the embodiments below, the present invention is explained in the liquid crystal display device, however, the present invention can be applied to the organic EL display device and the semiconductor device for photo sensor and so forth using TFTs.

Embodiment 1

Figure 1:
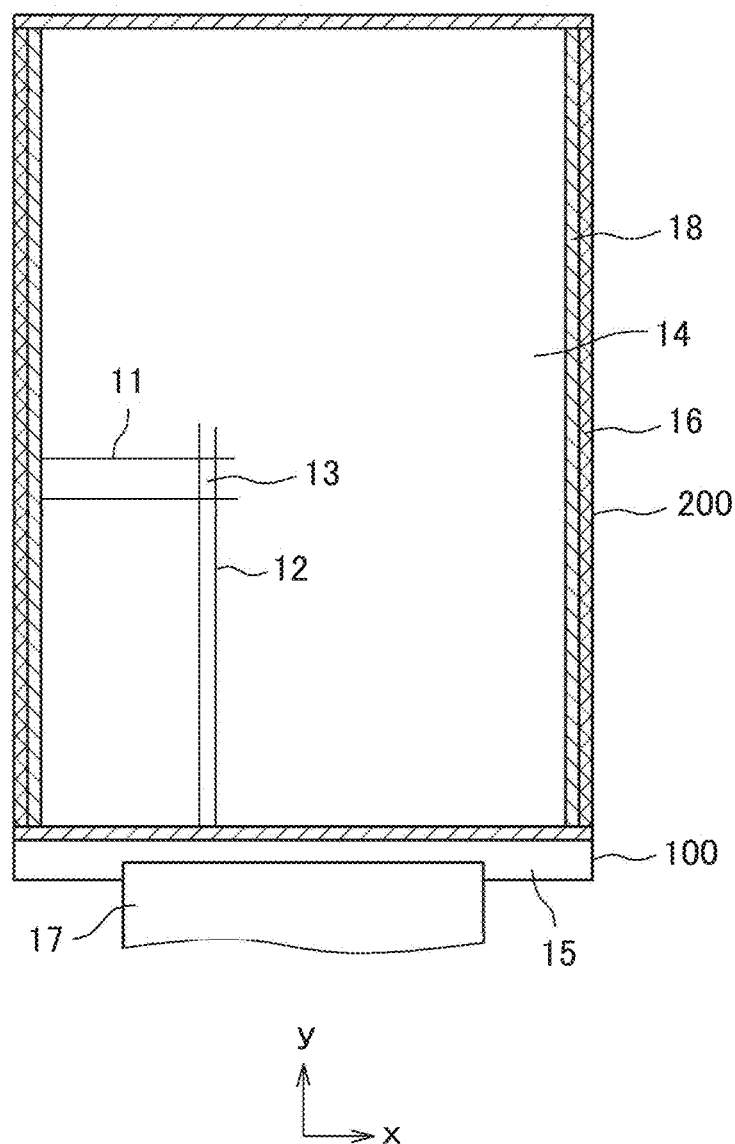
FIG. 1 is a plan view of a liquid crystal display device.

FIG. 1 is a plan view of the liquid crystal display device, to which the present invention is applied. In FIG. 1, the TFT substrate 100 and the counter substrate 200 are adhered to each other by the seal material 16; liquid crystal is sandwiched between the TFT substrate 100 and the counter substrate 200. The display area 14 is formed in an area where the TFT substrate 100 and the counter substrate 200 overlap each other. The scan line driving circuit 18 is formed by e.g. polysilicon semiconductor TFTs in the outer region of the display area 14.

The scan lines 11 extend in lateral direction (x direction) and are arranged in longitudinal direction (y direction); the video signal lines 12 extend in longitudinal direction and are arranged in lateral direction in the display area 14 of the TFT substrate 100. The pixel 13 is formed in an area surrounded by the scan lines 11 and the video signal lines 12. The TFT substrate 100 is made larger than the counter substrate 200; the terminal area 15 is formed in the area that the TFT substrate 100 does not overlap the counter substrate 200. The flexible wiring substrate 17 connects to the terminal area 15; the driver IC that drives the liquid crystal display device is installed on the flexible wiring substrate 17.

Since the liquid crystal is not self-luminous, a back light is set at the rear of the TFT substrate 100. The liquid crystal display panel generates pictures by controlling the light transmission through each of the pixels. The flexible wiring substrate 17 is bent back to the rear of the back light, thus, overall size of the liquid crystal display device is made compact.

The TFT of the oxide semiconductor, which has low leak current, is used in the display area 14 in the liquid crystal display device according to the present invention. The scan line driving circuit 18, for example, is formed in the peripheral area in the vicinity of the seal material 16. The TFTs of the polysilicon semiconductor, which has a high carrier mobility, are used in the scan line driving circuit 18.

Figure 2:
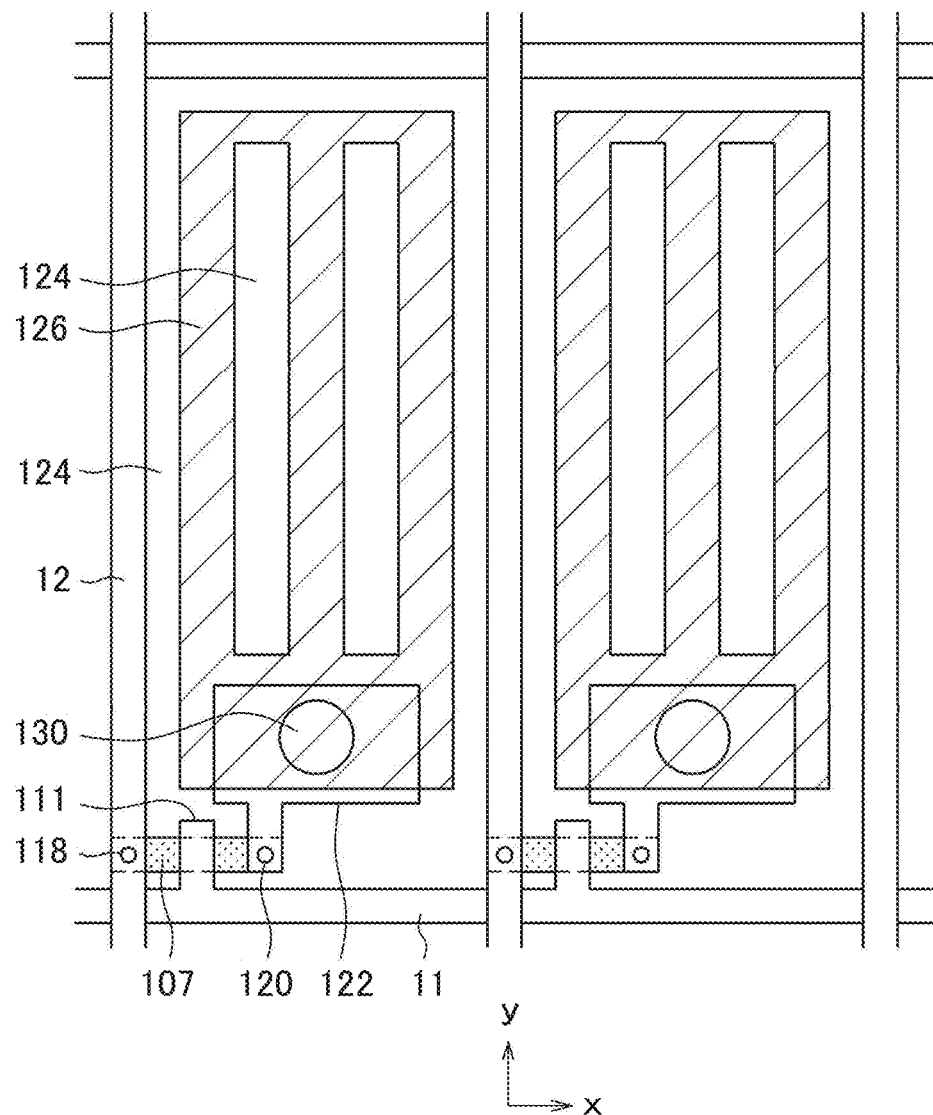
FIG. 2 is a plan view of a display area of the liquid crystal display device.

FIG. 2 is a plan view of the pixel 13 in the display area 14. FIG. 2 is a structure of so called FFS (Fringe Field Switching) mode of the IPS (In Plane Switching) liquid crystal display device. The TFT in FIG. 2 uses the oxide semiconductor 107. The oxide semiconductor TFT has low leak current, thus, it is suitable for the switching TFT.

In FIG. 2, the scan lines 11 extend in lateral direction (x direction) and are arranged in longitudinal direction (y direction); the video signal lines 12 extend in longitudinal direction and are arranged in lateral direction. The pixel electrode 126 is formed in the area surrounded by the scan lines 11 and the video signal lines 12. In FIG. 2, the oxide semiconductor TFT using the oxide semiconductor 107 is formed between the video signal line 12 and the pixel electrode 126. In the oxide semiconductor TFT, the video signal line 12 constitutes the drain electrode, a branch from the scan line 11 constitutes the gate electrode 111. The source electrode 122 of the oxide semiconductor TFT extends toward the pixel electrode 126 and connects with the pixel electrode 126 via through hole 130.

The pixel electrode 126 is formed like comb shaped. The common electrode 124 is formed in a planar shape under the pixel electrode 126 via the capacitance insulating film. The common electrode 124 is formed continuously common to plural pixels. When a video signal is applied to the pixel electrode 126, lines of forces are generated between the pixel electrode 126 and the common electrode 124 through the liquid crystal layer to rotate the liquid crystal molecules, consequently, pictures are formed. In FIG. 2, the light shading film (light shield electrode), which is formed between the TFT and the substrate, is omitted.

Figure 3:
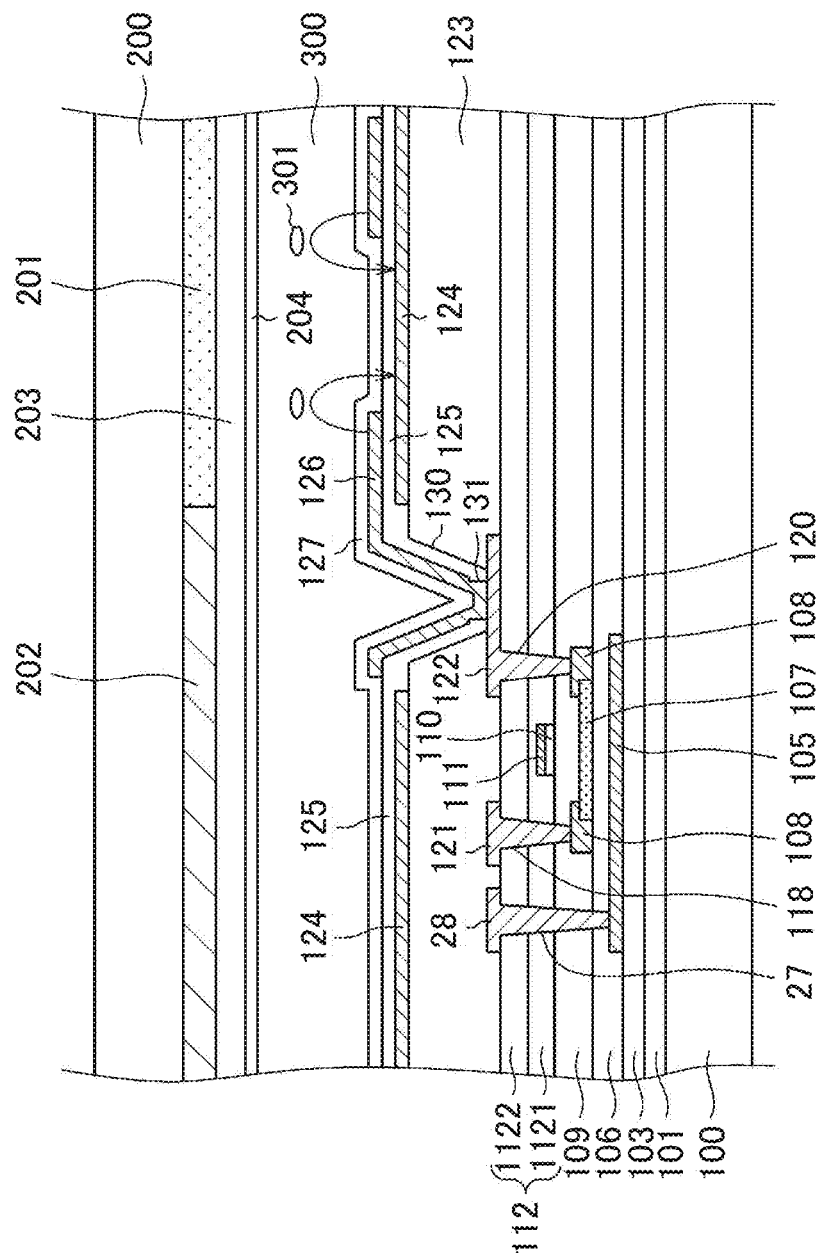
FIG. 3 is an example of a cross sectional view of the display area of the liquid crystal display device.

FIG. 3 is an example of a cross sectional view of the liquid crystal display device corresponding to FIG. 2. In this invention, the peripheral driving circuit is formed from polysilicon semiconductor TFTs as will be explained later. The polysilicon semiconductor TFT is nearer to the substrate than the oxide semiconductor TFT is. The gate insulating film 103 for the polysilicon semiconductor TFT is formed in the display area, too.

In FIG. 3, the under coat film (first insulating film) 101 is formed on the TFT substrate 100 formed from glass or resin such as polyimide. The under coat film 101 is formed to block impurities from the TFT substrate 100 formed from glass or resin such as polyimide. The under coat film 101 is formed from a laminated film of a silicon oxide film and a silicon nitride film. The first gate insulating film 103, which is for the polysilicon semiconductor TFT used in the peripheral circuit, is formed on the under coat film 101.

The light shading film 105 made of metal is formed on the first gate insulating film 103 to block the light from the back light so that photo current is not generated in the oxide semiconductor 107. Another important role of the light shading film 105 is to prevent the oxide semiconductor TFT from being influenced by electric charges accumulated in the TFT substrate 100. Specifically, when the TFT substrate 100 is formed from resin such as polyimide, which easily accumulates electric charges, the threshold voltage and so forth of the TFT are influenced by the electric charges in the TFT substrate 100.

Applying a reference voltage to the light shading film 105 can prevent the TFT from being influenced by the electric charges accumulated in the TFT substrate 100. A through hole needs to be formed in the insulating layer to apply the predetermined voltage (fixed voltage as common voltage) to the light shading film 105. In FIG. 3, the reference voltage is applied to the light shading film 105 through the shield wiring 28 via the through hole 27 formed through a plurality of insulating films. Common voltage is often used as a reference voltage. The light shading film 105, however, can be used as the gate electrode for the oxide semiconductor 107 formed above the light shading film 105 by applying the gate voltage to the light shading film 105.

The interlayer insulating film 106 is formed covering the light shading film 105. The interlayer insulating film 106 is formed from silicon oxide. The interlayer insulating film 106 can be a laminated structure of a silicon nitride film as an under layer and a silicon oxide film as an upper layer. The oxide semiconductor 107 is formed on the interlayer insulating film 106. In this embodiment, the oxide semiconductor 107 is formed from e.g. IGZO. A thickness of the oxide semiconductor 107 is e.g. 10 to 100 nm.

The protecting metals 108 are formed on the oxide semiconductor 107 at regions corresponding to the drain electrode 121 and the source electrode 122 after the oxide semiconductor is patterned. When the polysilicon semiconductor TFT is formed, the through hole for the polysilicon semiconductor TFT must be cleaned using hydrofluoric acid (HF). When the polysilicon semiconductor TFT and the oxide semiconductor TFT are formed on the same substrate, the hydrofluoric acid (HF) penetrates into the through holes for the oxide semiconductor 107, and dissolves the oxide semiconductor 107; the protecting metals 108 are used to protect the oxide semiconductor from the hydrofluoric acid (HF).

In FIG. 3, the second gate insulating film 109 is formed covering the oxide semiconductor 107. The second gate insulating film 109 is formed from silicon oxide. The second gate electrode 111 is formed on the second gate insulating film 109. In the meantime, oxygen must be supplied to the oxide semiconductor 107 to maintain the resistance of the channel of the oxide semiconductor 107 at a predetermined value. The aluminum oxide film 110 is formed between the oxide semiconductor 107 and the second gate electrode 111 to supply oxygen efficiently from the aluminum oxide film 110 to the oxide semiconductor 107. A thickness of the aluminum oxide film 110 is e.g. 10 nm, however, the thickness can be thicker.

The first inorganic passivation film 1121 is formed from e.g. silicon nitride, covering the second gate electrode 111. The second inorganic passivation film 1122 is formed from e.g. silicon oxide, on the first inorganic passivation film 1121. The inorganic passivation film 122 can be formed by one layer of a silicon oxide film or a silicon nitride film. Herein after, the first inorganic passivation film 1121 and the second inorganic passivation film 1122 are summarized as the inorganic passivation film (third insulating film) 112.

After the insulating films are formed, through holes 27, 118, 120 are formed to connect the TFT with the drain electrode 121 and the source electrode 122, and to connect the light shading film 105 with the shield wiring 28. In FIG. 3, the video signal line works as the drain electrode 121. The source electrode 122, extending on the inorganic passivation film 112, connects with the pixel electrode 126 at the through hole 130.

The organic passivation film 123 is formed by e.g. photo sensitive acrylic resin, covering the drain electrode 121 and the source electrode 122 and so forth. The organic passivation film 123 is made thick as 2 to 4 microns to reduce the floating capacitance between the video signal line and the common electrode and so forth. The through hole 130 is formed in the organic passivation film 123 to connect the source electrode 122 with the pixel electrode 126.

The common electrode 124 is formed from transparent conductive film of e.g. ITO (Indium Tin Oxide) on the organic passivation film 123 in planar shape. The capacitance insulating film 125 is formed from silicon nitride, covering the common electrode 124; the pixel electrode 126 is formed on the capacitance insulating film 125. One example of planar view of the pixel electrode 126 is shown in FIG. 2. A pixel capacitance is formed between the pixel electrode 126 and the common electrode 125 via the capacitance insulating film 125. The through hole 131 is formed in the capacitance insulating film 125 in the through hole 130 to connect the pixel electrode 126 with the source electrode 122.

The alignment film 127 is formed covering the pixel electrode 126 to control the initial alignment of the liquid crystal molecules 301. When a video signal voltage is applied to the pixel electrode 126, lines of forces as depicted in FIG. 3 are generated through the liquid crystal layer 300 to rotate the liquid crystal molecules 301, consequently, a transmittance in the pixel is controlled. Pictures are formed by controlling transmittance of light in each of the pixels.

In FIG. 3, the counter substrate 200 is formed from glass or resin such as polyimide, opposing to the TFT substrate 100 sandwiching the liquid crystal layer 300. The color filter 201 is formed on the counter substrate, corresponding to the pixel electrode 126, to form color images. The black matrix 202 is formed in a region where the color filter 201 does not exist to improve contrast. The overcoat film 203 is formed covering the color filter 201 and the black matrix 202. The overcoat film 203 prevents that the pigment of the color filter 201 oozes out in the liquid crystal layer 300. The alignment film 204 is formed on the overcoat film 203 to give initial alignment to the liquid crystal molecules 301.

Figure 4:
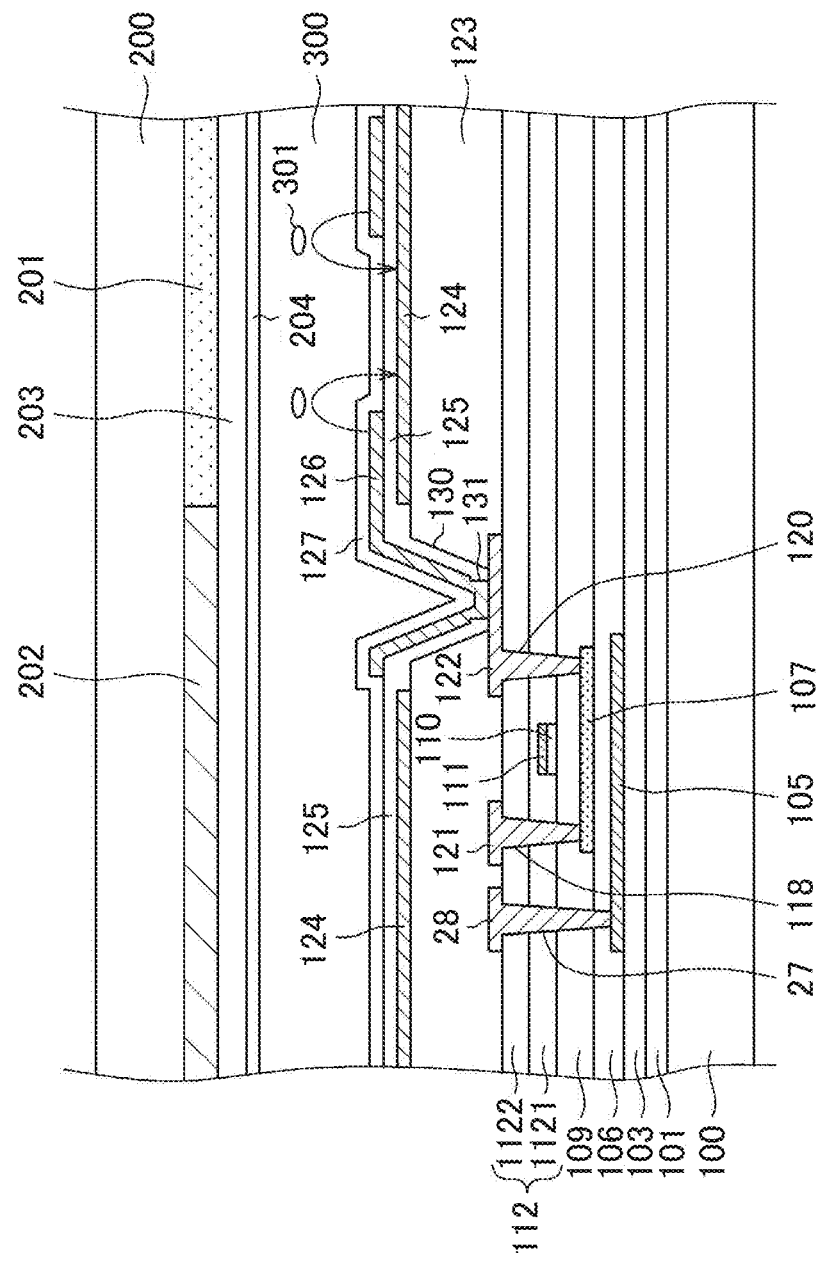
FIG. 4 is another example of a cross sectional view of the display area of the liquid crystal display device.

FIG. 4 is another example of cross sectional view of the liquid crystal display device corresponding to FIG. 2. FIG. 4 is generally the same as FIG. 3, however, FIG. 4 differs from FIG. 3 in the structure that the oxide semiconductor TFT directly connects with the drain electrode 121 and the source electrode 122. In FIG. 4, the protecting metals 108 are not formed between the oxide semiconductor 107 and the drain electrode 121 and between the oxide semiconductor 107 and the source electrode 122; the drain electrode 121 and the source electrode 122 connect directly to the oxide semiconductor 107.

As will be explained later, in the present invention, the protecting metals 108 can be eliminated because the through holes 118 and 120 are not yet formed when the through holes connecting to the polysilicon semiconductor are cleaned by hydrofluoric acid (HF). Other structures in FIG. 4 are the same as the structures of FIG. 3.

Figure 5A:
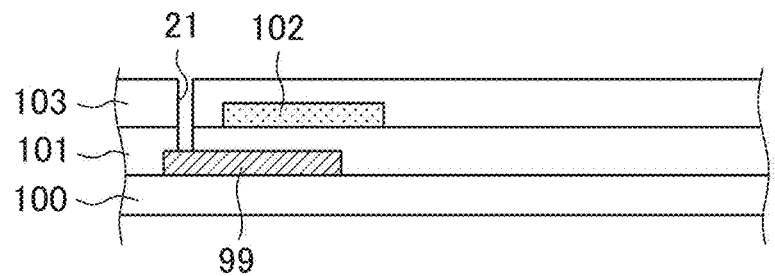
FIG. 5A is a cross sectional view of the structure in the midway process of the comparative example.
Figure 5B:
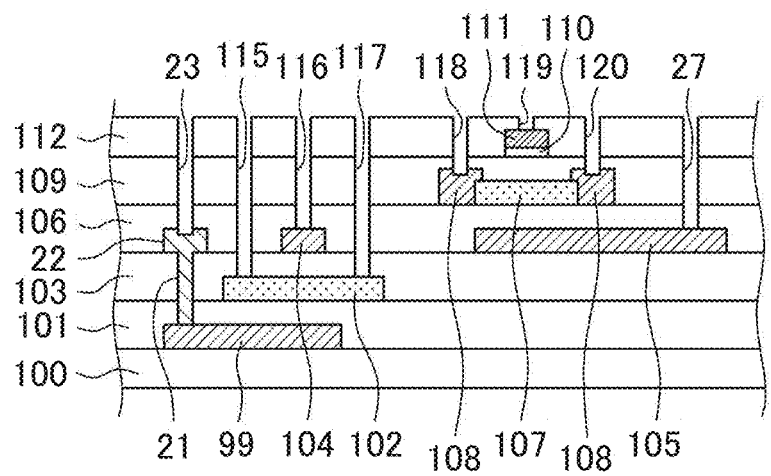
FIG. 5B is a cross sectional view of the structure in the midway process of the comparative example.
Figure 5C:
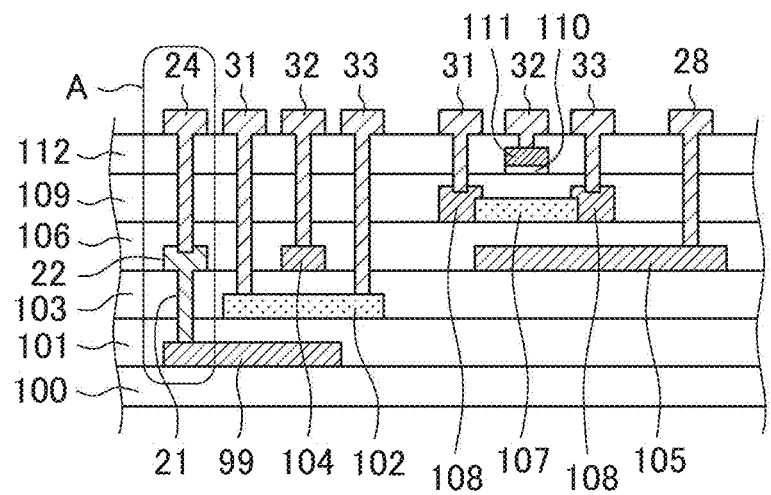
FIG. 5C is a cross sectional view of the representative structure of the comparative example.

FIGS. 5A through 5C are comparative example to the present invention; FIGS. 5A through 5C are cross sectional views, in which the polysilicon semiconductor TFT and the oxide semiconductor TFT are drawn in parallel. FIG. 5C is a cross sectional view, in which the polysilicon semiconductor TFT and the oxide semiconductor TFT are drawn in parallel; FIGS. 5A and 5B are cross sectional views in midway process. In the actual products, the polysilicon semiconductor TFT is formed in the peripheral driving circuit, and the oxide semiconductor TFT is formed in the display area, therefore, the polysilicon semiconductor TFT is in a different area apart from an area the oxide semiconductor TFT is; however, both of TFTs are drawn side by side for explanation; the situation is the same for other figures. FIG. 5C corresponds to FIG. 3, however, the upper structures from the organic passivation film 123 of FIG. 3 are omitted in FIG. 5C; the situation is the same for other figures.

The structure, in which the polysilicon semiconductor TFT and the oxide semiconductor TFT are formed on the same substrate, is sometimes called a hybrid structure. In the hybrid structure, the polysilicon semiconductor TFT is often formed before the oxide semiconductor TFT is formed because higher process temperature is necessary for the polysilicon semiconductor TFT. Herein after, explanation is made as that the TFT substrate 100 is formed from polyimide, however, the same structure can be applicable even when the TFT substrate 100 is formed from other resins or glass.

In FIG. 5A, the first light shading film 99 for the polysilicon semiconductor TFT is formed on the TFT substrate 100 to prevent generation of photo current in the polysilicon semiconductor TFT due to the light from the back light. Other important role of the light shading film 99 is to electrically shield the polysilicon semiconductor 102 from influence from the charges accumulated in the TFT substrate 100. Therefore, a predetermined voltage (e.g. common voltage or fixed voltage) needs to be applied to the light shading film 99, consequently, the through hole 21 is formed through the under coat 101 and the first gate insulating film 103.

The under coat film 101 is formed on the light shading film 99; polysilicon semiconductor 102 is formed on the under coat film 101. Polysilicon semiconductor 102 is generally formed by low temperature process (it is sometimes called LTPS (Low Temperature poly-Si)). Concretely, the a-Si semiconductor is formed by CVD; then the a-Si semiconductor is transformed to the polysilicon semiconductor 102 by being irradiated with excimer laser; subsequently, the polysilicon semiconductor 102 is patterned. The first gate insulating film 103 is formed covering the polysilicon semiconductor 102. After that, the through hole 21 is formed through the under coat film 101 and the first gate insulating film 103 to supply the predetermined voltage to the light shading film 99.

FIG. 5B is a structure in the process following FIG. 5A. In FIG. 5B, the first gate electrode 104 is formed on the first gate insulating film 103 for the polysilicon semiconductor TFT. At the same time, the light shading film (second light shading film) 105 for the oxide semiconductor TFT, and the connecting wiring 22 to supply a voltage to the light shading film (first light shading film) 99 for polysilicon semiconductor TFT, are formed by the same process and with the same material. The role of the second light shading film 105 is the same as explained in FIG. 3. The materials for the first gate electrode 104 and so forth are MoW alloy, a laminated film of Ti—Al—Ti and so forth.

After that, the interlayer insulating film 106 is formed from silicon oxide. By the way, the interlayer insulating film 106 can be formed by laminated film of a silicon nitride film and a silicon oxide film; in this case, the silicon oxide film is an upper layer and the silicon nitride film is a lower layer. The oxide semiconductor 107 is formed on the interlayer insulating film 106.

After the oxide semiconductor 107 is patterned, the protecting metals 108 are formed to cover the drain and the source of the oxide semiconductor 107 to avoid that the oxide semiconductor 107 is dissolved during the cleaning process of the through holes with hydrofluoric acid (HF). For example, the laminated film of Ti—Al—Ti and so forth are used for the protecting metal 108.

In FIG. 5B, the second gate insulating film 109 is formed from silicon oxide covering the oxide semiconductor 107. At the outset, the aluminum oxide film 110 is formed on the second gate insulating film 109 to supply oxygen to the channel of the oxide semiconductor 107. The second gate electrode 111 is formed on the aluminum oxide film 110. The materials for the second gate electrode 111 are the same as the materials for the first gate electrode 104. The inorganic passivation film 112 is formed covering the second gate electrode 111. In FIG. 5B, the inorganic passivation film 112 is one layer, however, the inorganic passivation film 112 can be a two layer structure; the two layer structure is the same as explained in FIG. 3.

In FIG. 5B, the through holes 118, 119 and 120 for the oxide semiconductor TFT, the through hole 27 for the second light shading film 105, through holes 115, 116 and 117 for the polysilicon semiconductor TFT, and the through hole 23 for the first light shading film 99 are formed. Since the oxide film is formed on the polysilicon semiconductor 102, the insides of the through holes 115 and 117 are cleaned with hydrofluoric acid (HF) to eliminate the oxide film after the though holes are formed. At this time, hydrofluoric acid (HF) penetrates in the through holes 118 and 120 for the oxide semiconductor 107, as a result, the oxide semiconductor 107 is dissolved at the through holes 118 and 120. To avoid this problem, the protecting metals 108 are formed on the oxide semiconductor 107 at the place corresponding to the through holes 118 and 120.

FIG. 5C is a structure in the process following FIG. 5B. In FIG. 5C, the wirings or electrodes are formed in the through hole formed in FIG. 5B to supply voltages. The electrodes formed in this process are the drain electrodes 31, gate electrodes 32, source electrodes 33 for the oxide semiconductor TFT and the polysilicon semiconductor TFT; the wirings are shield wiring 24 for the first light shading film 99 and the second shield wiring 28 for the second light shading film 105 and so forth.

The structure of 5C explained above has following problems. The first problem is forming the protecting metal 108 on the oxide semiconductor 107. The oxide semiconductor 107 is patterned; then the protecting metal 108 is formed covering the patterned oxide semiconductor 107, subsequently, the protecting metal 108 is patterned by dry etching and so forth. The protecting metal 108 is formed covering the oxide semiconductor 107 by sputtering; however, during the sputtering, the oxide semiconductor 107 is contaminated. When the protecting metal 108 is formed from MoW, fluorine based gas is used for dry etching; when the protecting metal 108 is formed from laminated film of Ti—Al—Ti, chloride based gas is used for dry etching. By the way, if tapering is required for the patterned protecting metal 108, MoW is used for the material of the protecting metal 108. The channel of the oxide semiconductor 107 is contaminated by protecting metal 108 and dry etching process for patterning the protecting metal 108 during forming the protecting metal 108. This contamination causes fluctuation in characteristics of oxide semiconductor TFT, e.g. fluctuation in thresh hold voltage.

Figure 6:
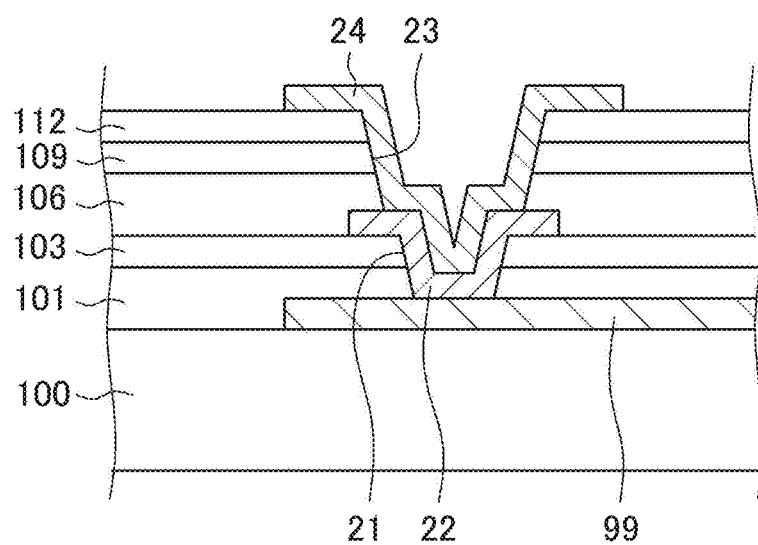
FIG. 6 is a cross sectional view corresponding to A portion in FIG. 5C.

The second problem is that the through holes and the electrodes need to be formed twice to supply voltage to the first light shading film 99. This is depicted by through holes 21 and 23 and the shield wrings 22 and 24 in FIGS. 5A through 5C. This portion is depicted as A region in FIG. 5C. FIG. 6 is an enlarged view of the region A of FIG. 5C.

In FIG. 6, the under coat film 101 and the first gate insulating film 103 are formed covering the first light shading film 99; the through hole 21 is formed in the under coat film 101 and the first gate insulating film 103; subsequently, the connecting wiring 22 is formed. After that, the interlayer insulating film 106, the second gate insulating film 109, and the inorganic passivation film 112 are formed; after that, the through hole 23 is formed in those three films. After the shield wiring 24 is formed in the through hole 23, the shield wiring 24 and the first light shading film 99 are connected to each other.

Namely, in the structure of FIG. 6, two times of photo lithography is necessary for the through holes and the shield wirings. Among the through holes, the through hole 23 is formed by the same process as through holes for the TFTs, however, the forming through hole 21 is the process only for the first light shading fil 99. In the meantime, the connecting wiring 22 can be formed by the same process as forming gate electrode and so forth.

Figure 7A:
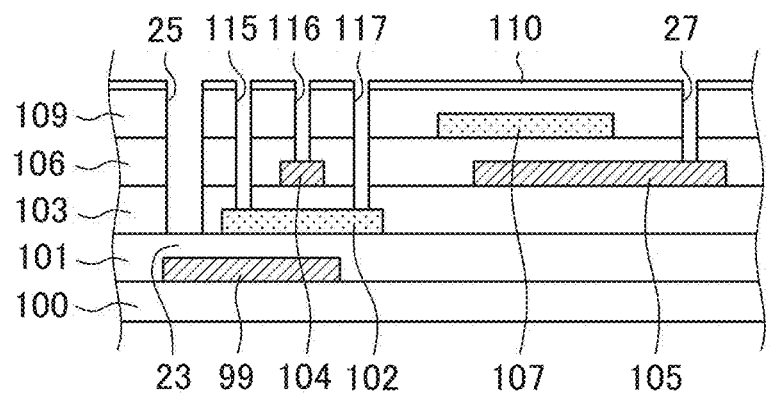
FIG. 7A is a cross sectional view of the structure in the midway process of embodiment 1.
Figure 7B:
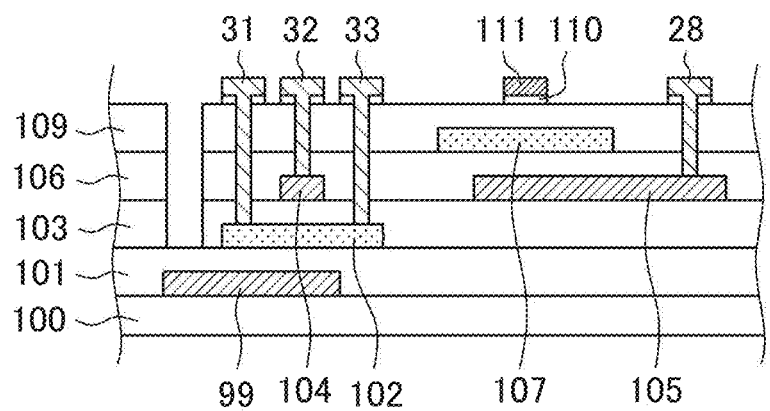
FIG. 7B is a cross sectional view of the structure in the midway process of embodiment 1.
Figure 7C:
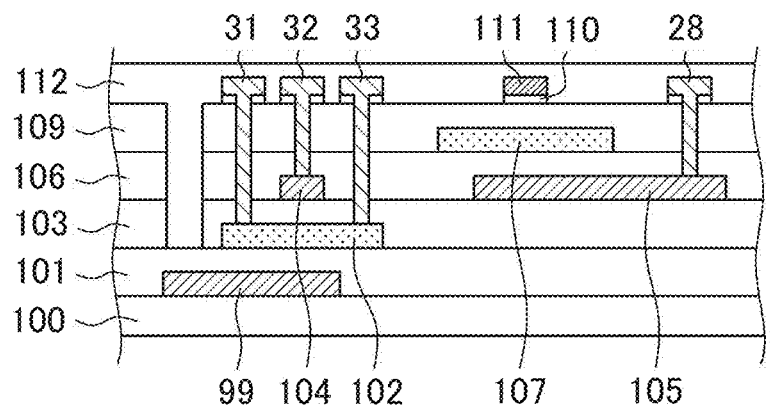
FIG. 7C is a cross sectional view of the structure in the midway process of embodiment 1.
Figure 7D:
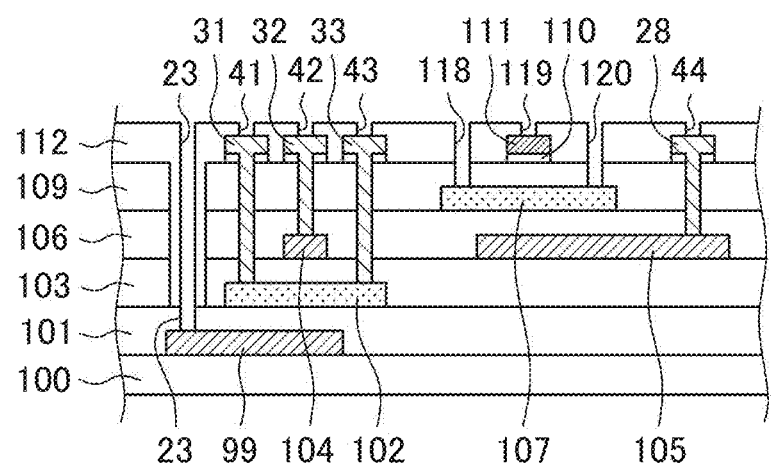
FIG. 7D is a cross sectional view of the structure in the midway process of embodiment 1.
Figure 7E:
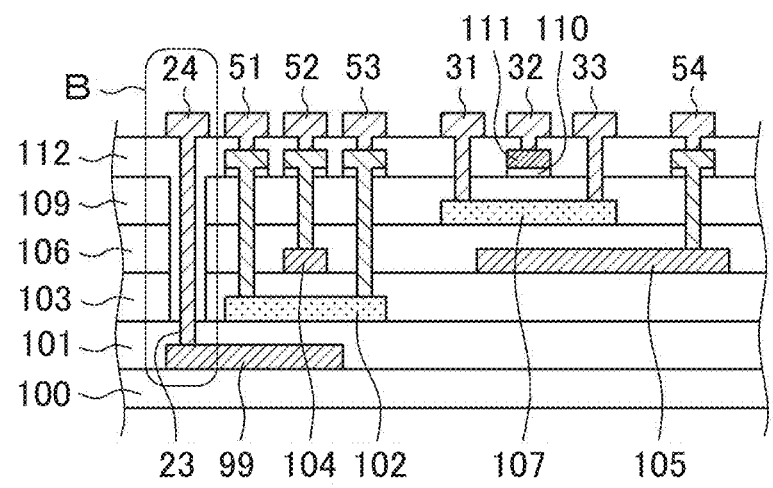
FIG. 7E is a cross sectional view of the representative structure of embodiment 1.

FIG. 7E is a cross sectional view of the hybrid structure according to the present invention, by which countermeasures for the above explained two problems are applied; FIGS. 7A through 7D are the cross sectional views in the midway processes. FIG. 7A is a cross sectional view in which the aluminum oxide film 110 is formed on the second gate insulating film 109. FIG. 7A differs from FIG. 5 and so forth in that the protecting metal 108 does not exist on the drain and the source of the oxide semiconductor 107. Therefore, there is no contamination to the oxide semiconductor 107 due to the processes to form the protecting metal 108. Consequently, the characteristics of the oxide semiconductor TFT can be made more stable.

The through hole (the first through hole) 25 for the first light shading film 99, the through holes 115, 116, and 117 for the polysilicon semiconductor TFT, and the through hole 27 for the second light shading film 105 are formed simultaneously. The insides of the through holes 115 and 117 for the polysilicon semiconductor TFT are cleaned by hydrofluoric acid (HF) to eliminate the silicon oxide on the polysilicon semiconductor 107; however, in the present embodiment, the through holes for the oxide semiconductor TFT are not yet formed during this cleaning process by hydrofluoric acid (HF), thus, the oxide semiconductor 107 is not dissolved.

FIG. 7B is a cross sectional view in which the electrodes and the wirings are formed in the through holes 115, 116, 117, and 27 simultaneously with forming the second gate electrode 111. However, the connecting wiring is not yet formed in the through hole 25 for the first light shading film 99. FIG. 7C is a cross sectional view in which the structure of FIG. 7B is coated with the inorganic passivation 112. FIG. 7D is a cross sectional view in which through holes 23 (the second through hole), 41 (one of the third through holes), 42

(the fourth through holes), 43 (another one of the third through holes), 44, 118, 119 (the fifth through hole), and 120 are formed.

FIG. 7D is a cross sectional view in which the through holes are formed in the inorganic passivation film 112. In FIG. 7D, through holes 23 (the second through hole) is formed not only in the inorganic passivation film 112 (the third insulating film) but also in the under coat film 101 (the first insulating film). The through holes 118 and 120 are formed not only in the inorganic passivation film 112 (the third insulating film) but also in the second gate insulating film 109. FIG. 7E is a cross sectional view in which connecting wirings (also referred to as the conductive materials or the electrodes) 24, 31, 32, 33, 51, 52, 53, and 54 are formed. Thus, each of the polysilicon semiconductor TFT, the first light shading film 99 (also referred to as the first conductive film), the oxide semiconductor TFT, and the second light shading film 105 (also referred to as the second conductive film) is possible to take an electrical connection. The connecting wiring 24 is also referred to as the first conductive material, which connects with the first light shading film 99. The connecting wiring 31 is also referred to as the drain electrode, the connecting electrode 51 is also referred to as the first connecting wiring connecting with the drain electrode. The connecting wiring 33 is also referred to as the source electrode, the connecting wiring 53 is also referred to as the first connecting wiring connecting to the source electrode, the connecting wiring 32, which connects with the first gate electrode 104, is also referred to as the second connecting wiring, the connecting wiring 52 is also referred to as the first gate wiring connecting to the second connecting wiring. The connecting wiring 32, which connects with the second gate electrode 111, is also referred to as the second gate wring.

As described above, according to the present invention, a contamination to the oxide semiconductor when the protecting metal is formed can be avoided because the protecting metal is not formed on the oxide semiconductor 107. In addition, the manufacturing cost can be decreased because the process to form the through hole only for the first light shading film 99 can be eliminated.

Figure 8:
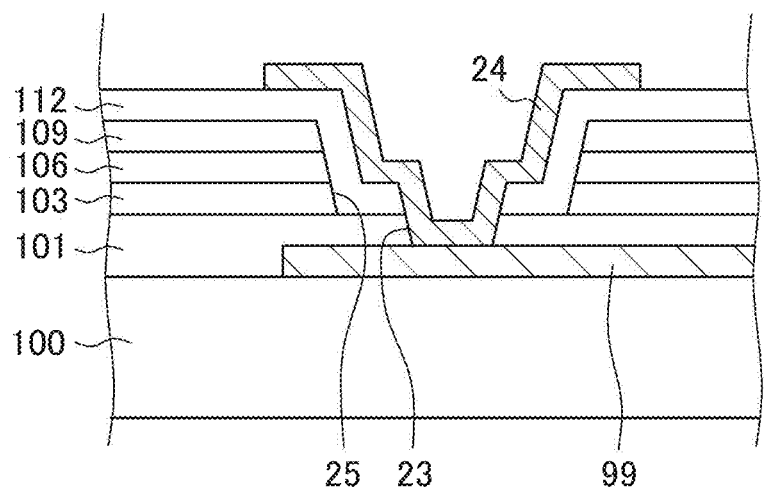
FIG. 8 is a cross sectional view corresponding to B portion in FIG. 7E.

FIG. 8 is an enlarged cross sectional view of the region indicated by B in FIG. 7E, in which the first light shading film 99 is connected with the shield wiring 24. In FIG. 8, the first light shading film 99 is formed on the TFT substrate 100; the under coat film 101 is formed on the first light shading film 99. The first gate insulating film 103, the interlayer insulating film 106, the second gate insulating film 109, and the inorganic passivation film 112 are formed in this order on the under coat film 101. The through hole 25 is formed in the first gate insulating film 103, the interlayer insulating film 106, and the second gate insulating film 109 simultaneously. Namely, the through hole 25 is simultaneously formed in a laminated film of plural insulating films (second insulating films), which exists on at least one insulating film (the first insulating film, e.g. the under coat film 101). The through hole 23 is simultaneously formed in the inorganic passivation film 112 and the under coat film 101. A part of the inorganic passivation film 112 exists in the through hole 25; the through hole 23 is simultaneously formed in the part of the inorganic passivation film 112 and the under coat film 101. Each of the through holes 23 and 25 is formed simultaneously with through holes for the TFTs, therefore, the process to form the through hole only for the first light shading film 99 is not necessary.

Figure 9:
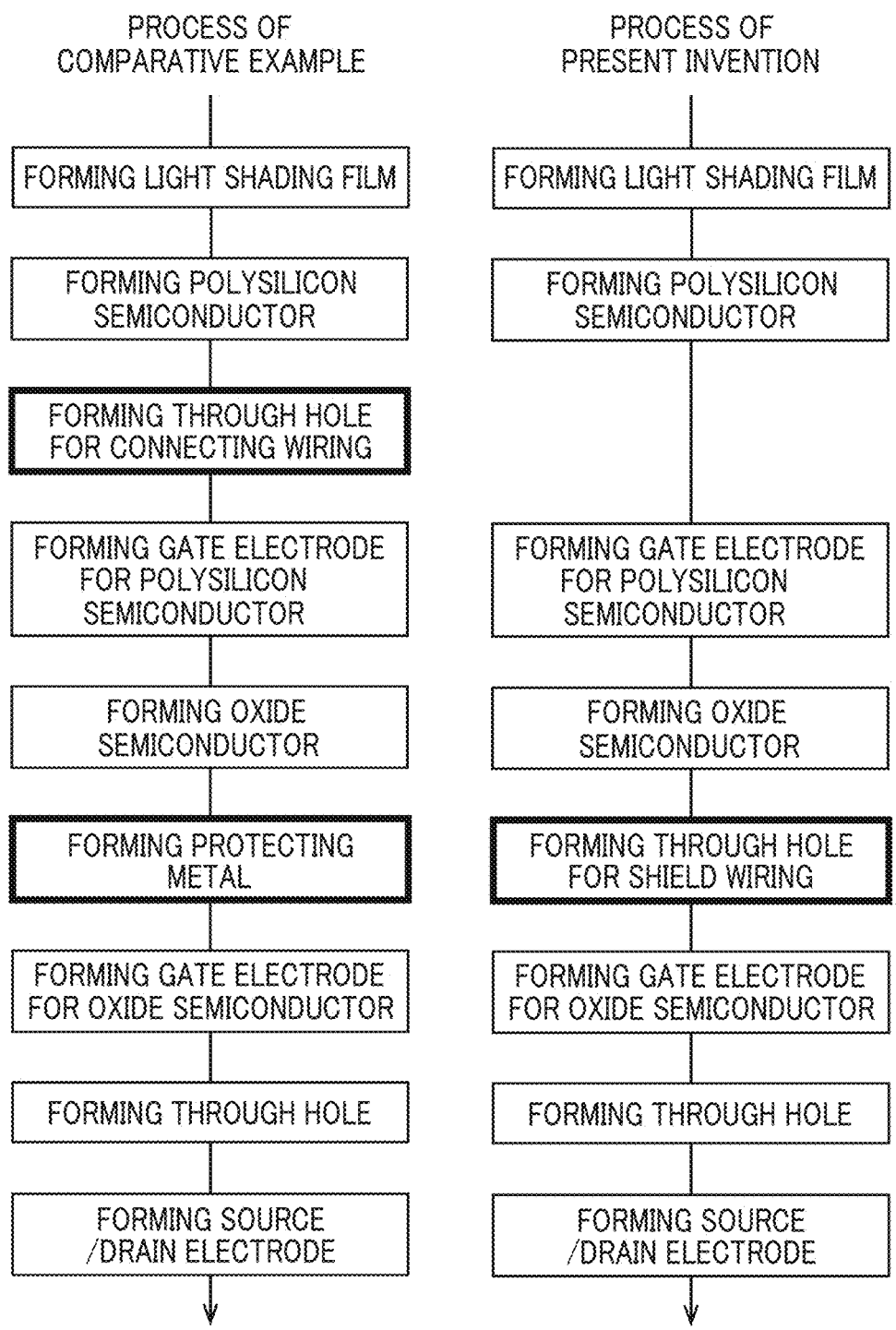
FIG. 9 is flow charts which show the processes for the comparative example and the processes for the present invention.

FIG. 9 is process charts which compares the comparative example explained relating to FIG. 5A through FIG. 5C with the present invention explained in FIG. 7A through FIG. 7E. In FIG. 9, the comparative example corresponds to FIG. 5A through FIG. 5C; the present invention corresponds to FIG. 7A through FIG. 7E. The contents of each of the processes are the same as explained in FIGS. 5A through 5C and in FIGS. 7A through 7E. In comparing the processes of the comparative example with the process of the present invention, the process for forming the through hole (corresponds to 21 in FIG. 5A) for the connecting wiring, which is shown by thick enclosure in the comparative example in FIG. 9, is eliminated in the process of the present invention. In the process of the present invention, "forming through hole for shield wiring", which is shown by thick enclosure, the through hole 25 is formed simultaneously through the second gate insulating film 109, the interlayer insulating film 106 and the first gate insulating film 103, and therefore, the undercoat film 101 is exposed.

In addition, the process of forming the protecting metal in the comparative example is eliminated in the process of the present invention. Therefore, the process of the present invention shown in FIG. 9 can decrease the number of processes.

Embodiment 2

Figure 10A:
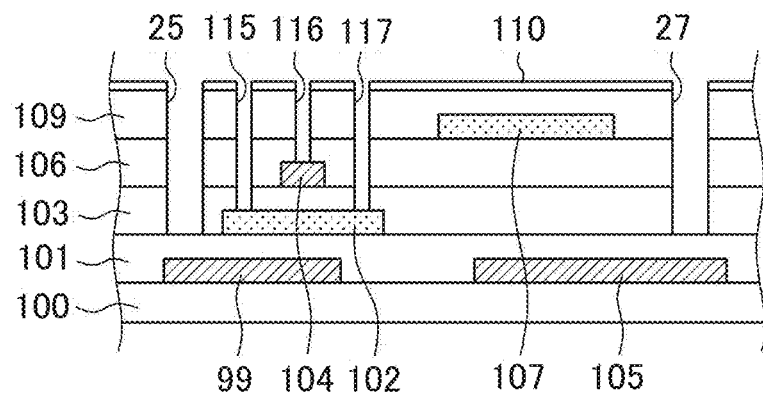
FIG. 10A is a cross sectional view of the structure in the midway process of embodiment 2.
Figure 10B:
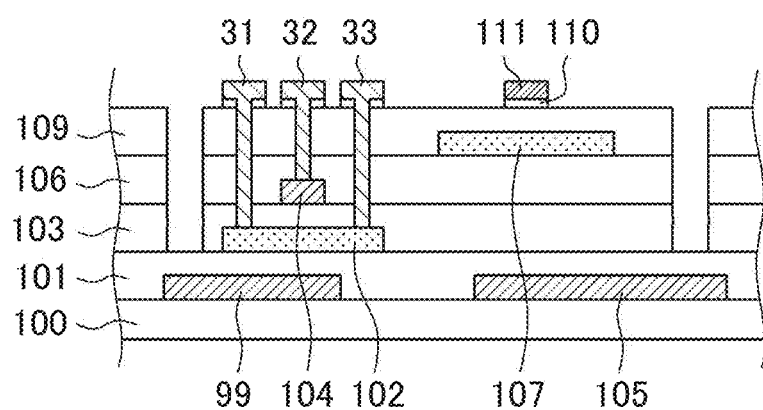
FIG. 10B is a cross sectional view of the structure in the midway process of embodiment 2.
Figure 10C:
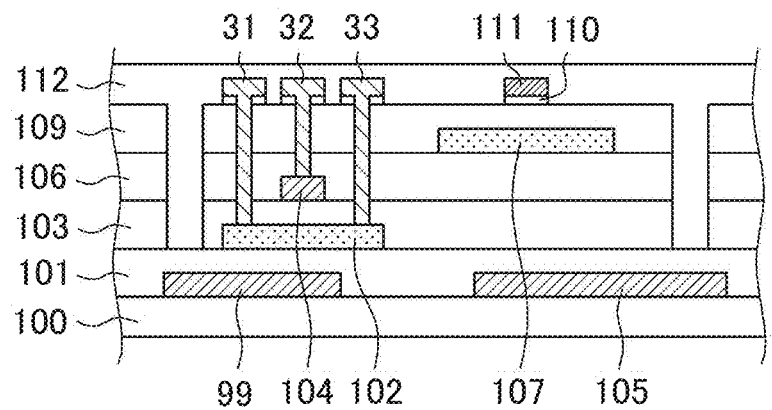
FIG. 10C is a cross sectional view of the structure in the midway process of embodiment 2.
Figure 10D:
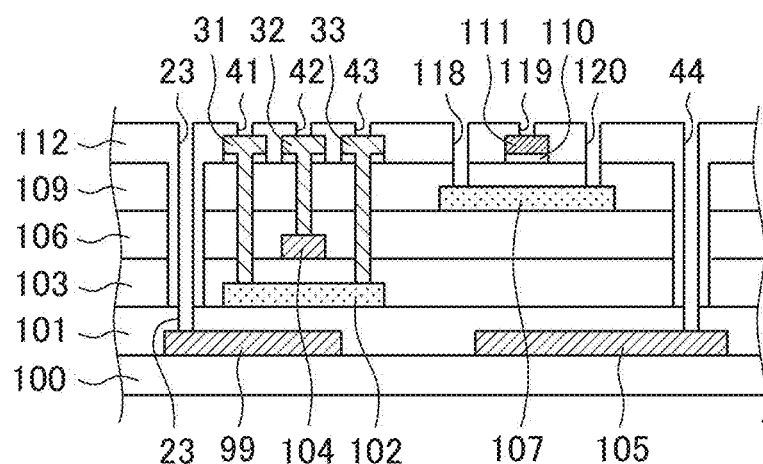
FIG. 10D is a cross sectional view of the structure in the midway process of embodiment 2.
Figure 10E:
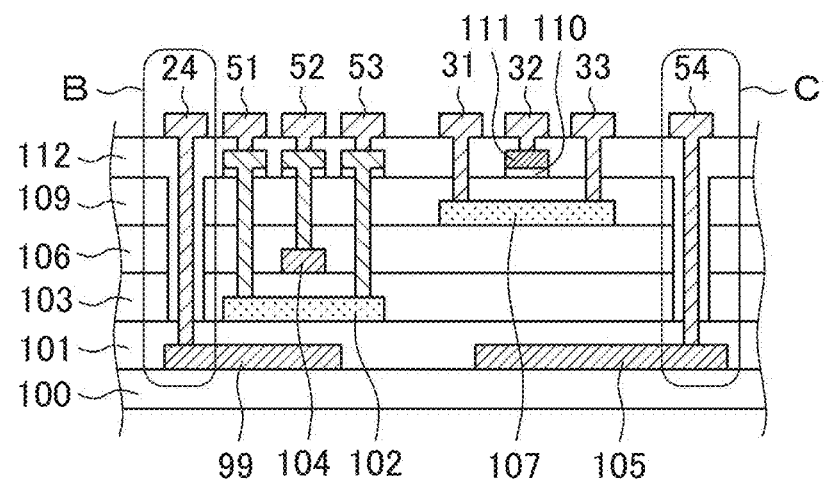
FIG. 10E is a cross sectional view of the representative structure of embodiment 2.

FIG. 10E is a cross sectional view of the structure of embodiment 2 of the present invention; FIGS. 10A through 10D are the cross sectional views in the midway processes to realize the structure of FIG. 10E. The structure of FIG. 10E also has merits, as with embodiment 1, that the contamination to the oxide semiconductor due to the process forming the protecting metal can be avoided and that the number of the processes can be decreased compared with the comparative example. The feature of embodiment 2 is that the second light shading film 105 is formed on the same layer of the first light shading film 99 on the TFT substrate 100.

In FIG. 10A, the first light shading film 99 and the second light shading film 105 are formed on the TFT substrate 100. Therefore, only the first gate electrode 104, which is for the polysilicon semiconductor TFT, is formed on the first gate insulating film 103. The through hole 27 (sixth through hole), which gives connection to the second light shading film 105, is formed through the second gate insulating film 109, the interlayer insulating film 106, and the first gate insulating film 103 as the same as the through hole 25, which gives connection to the first light shading film 99.

In FIG. 10B, the electrodes 31, 32, and 33 for the polysilicon semiconductor TFT and the gate electrode 111 for the oxide semiconductor TFT are formed. In FIG. 10C, the inorganic passivation film 112 is formed covering the electrodes 31, 32, and 33 for the polysilicon semiconductor TFT and the gate electrode 111 for the oxide semiconductor TFT. FIG. 10D is a cross sectional view, in which the through holes 23, 41, 42, 43, 44 (the seventh through hole), 118, 119 and 120 for the various electrodes are formed. FIG. 10E is a cross sectional view, in which the connecting wirings (also referred to as the conductive materials or the electrodes) 24, 31, 32, 33, 51, 52, 53, and 54 (the second conductive material) are formed to enable to supply voltages to the first light shading film 99, the polysilicon semiconductor TFT, the second light shading film 105, and the oxide semiconductor TFT.

In FIG. 10E, the through holes and the shapes of the electrodes to supply voltages to the first light shading film 99 in the region B and the through holes and the shapes of the electrodes to supply voltages to the second light shading film 105 in the region C are the same. Namely, the detailed sectional views of the region B and the region C in FIG. 11E are the same as FIG. 8.

Embodiment 3

Figure 11A:
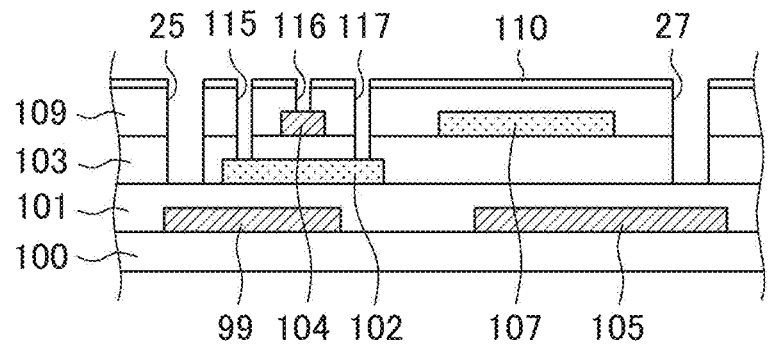
FIG. 11A is a cross sectional view of the structure in the midway process of embodiment 3.
Figure 11B:
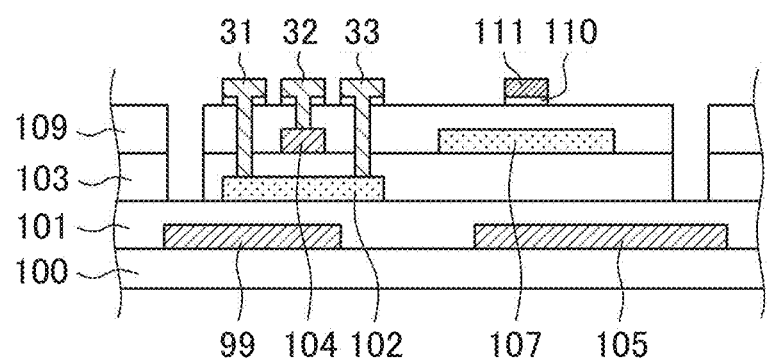
FIG. 11B is a cross sectional view of the structure in the midway process of embodiment 3.
Figure 11C:
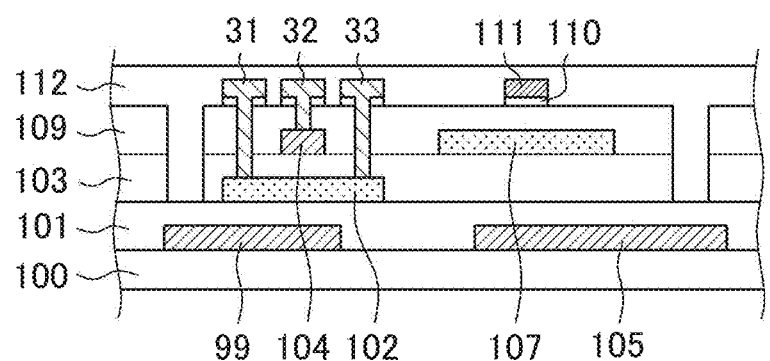
FIG. 11C is a cross sectional view of the structure in the midway process of embodiment 3.
Figure 11D:
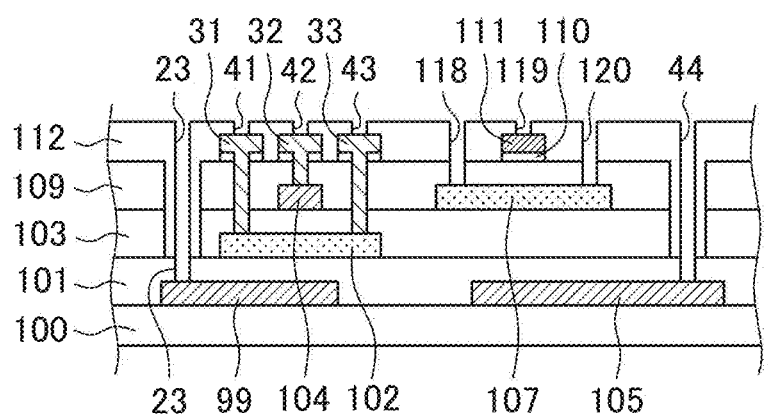
FIG. 11D is a cross sectional view of the structure in the midway process of embodiment 3.
Figure 11E:
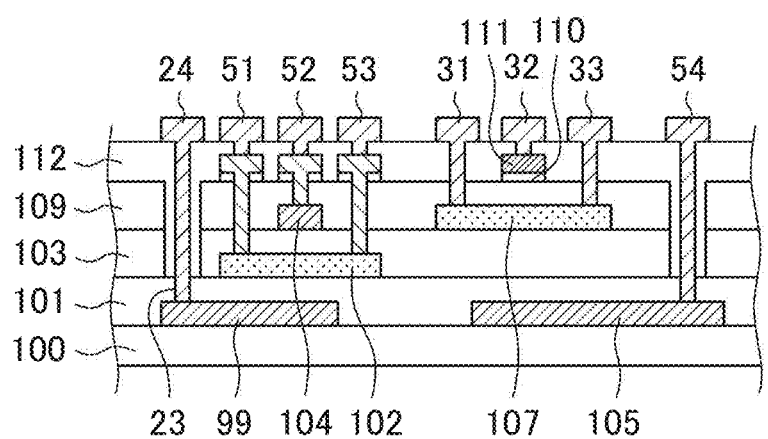
FIG. 11E is a cross sectional view of the representative structure of embodiment 3.

FIG. 11E is a cross sectional view of the structure of embodiment 3 of the present invention; FIGS. 11A through 11D are the cross sectional views in the midway processes to realize the structure of FIG. 11E. Embodiment 3 also has a structure that the second light shading film 105 is formed on the TFT substrate 100, on the same layer of the first light shading film 99. The structure of FIG. 11E also has merits, as with embodiment 1, that the contamination to the oxide semiconductor due to the process forming the protecting metal can be avoided and that the number of the processes can be decreased compared with the comparative example. The feature of embodiment 3 is that the interlayer insulating film 106 is eliminated.

In FIG. 11A, the gate electrode 104 and the oxide semiconductor 107 are formed on the first gate insulating film 103; the second gate insulating film 109 is formed covering those layers. Namely, the interlayer insulating film 106 is eliminated. The first gate electrode 104 and the oxide semiconductor 107 exist on the first gate insulating film 103; however, contamination of the oxide semiconductor 107 due to formation of the first gate electrode 104 can be avoided by forming the first gate electrode 104 before forming the oxide semiconductor 107.

In FIG. 11B, the electrodes 31, 32, and 33 for the polysilicon semiconductor TFT and the gate electrode 111 for the oxide semiconductor TFT are formed. FIG. 11C is a cross sectional view in which the inorganic passivation film 112 is formed covering the electrodes 31, 32, and 33 for the polysilicon semiconductor TFT and the gate electrode 111 for the oxide semiconductor TFT.

FIG. 11D is a cross sectional view, in which the through holes 23, 41, 42, 43, 44, 118, 119 and 120 corresponding to each of the electrodes. FIG. 11E is a cross sectional view, in which the connecting wirings (also referred to as the conductive materials or the electrodes) 24, 31, 32, 33, 51, 52, 53, and 54 are formed to enable to give voltages to the first light shading film 99, the polysilicon semiconductor TFT, the second light shading film 105, and the oxide semiconductor TFT.

Since the interlayer insulating film 106 is eliminated in the structure of embodiment 3, embodiment 3 has further merit that process burden can be decreased, in addition to the merit of embodiment 1.

Embodiment 4

Figure 12A:
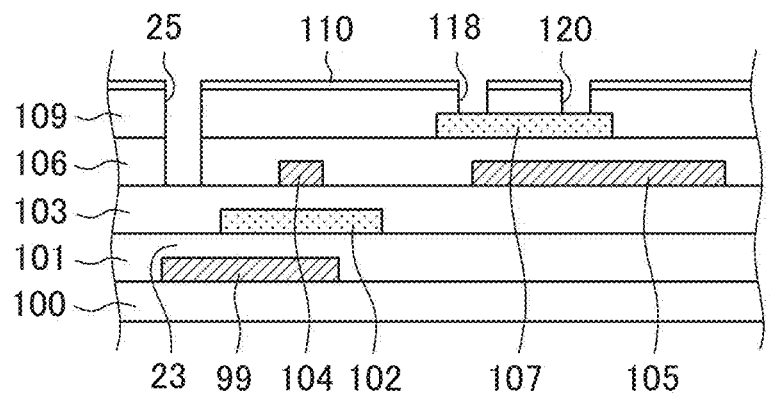
FIG. 12A is a cross sectional view of the structure in the midway process of embodiment 4.
Figure 12B:
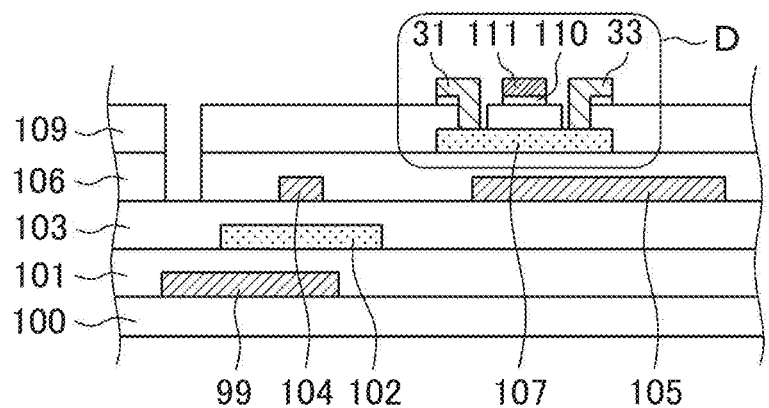
FIG. 12B is a cross sectional view of the structure in the midway process of embodiment 4.
Figure 12C:
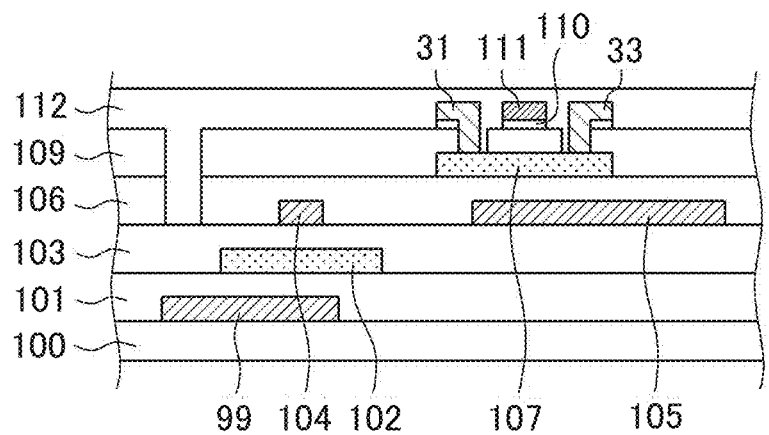
FIG. 12C is a cross sectional view of the structure in the midway process of embodiment 4.
Figure 12D:
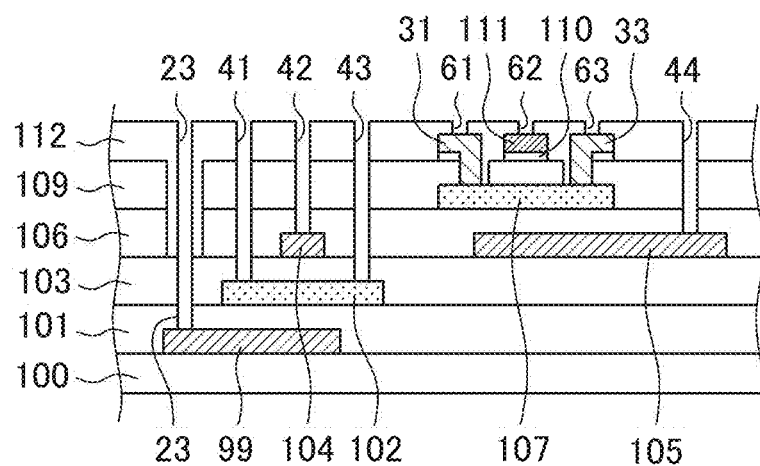
FIG. 12D is a cross sectional view of the structure in the midway process of embodiment 4.
Figure 12E:
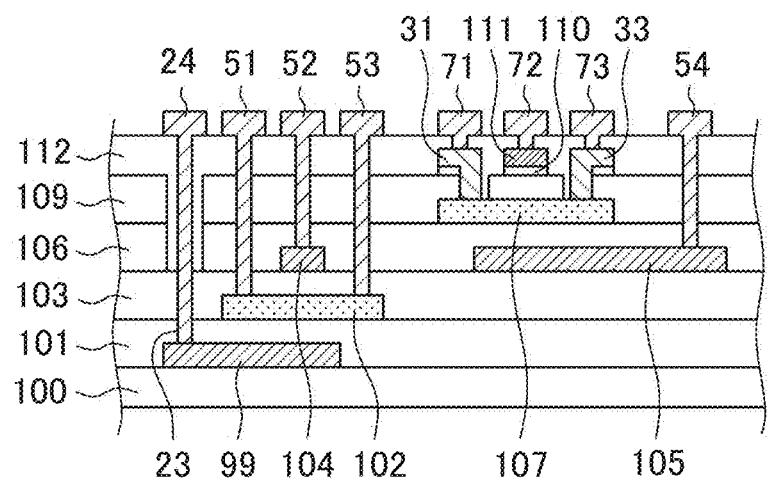
FIG. 12E is a cross sectional view of the representative structure of embodiment 4.

FIG. 12E is a cross sectional view of the structure of embodiment 4 of the present invention; FIGS. 12A through 12D are the cross sectional views in the midway processes to realize the structure of FIG. 12E. The structure of FIG. 12E also has merits, as with embodiment 1, that the contamination to the oxide semiconductor 107 due to the process forming the protecting metal 108 can be avoided and that the number of the processes can be decreased compared with the comparative example. The feature of embodiment 4 is that the through holes for the oxide semiconductor TFTs are formed before the through holes for the polysilicon semiconductor TFTs are formed.

The layer structure of FIG. 12A is the same as that of FIG. 7A of embodiment 1; however, through holes are different. In FIG. 12A, only the through hole 25 for the first light shading film 99, the through holes 118 (eighth contact hole) and 120 (ninth contact hole) for the oxide semiconductor TFT are formed.

FIG. 12B is a cross sectional view in which the drain electrode 31, the gate electrode 111 and the source electrode 33 are formed for the oxide semiconductor TFT. In FIG. 12B, the drain electrode 31 does not full fill the through hole 118; and the source electrode 33 does not full fill the through hole 120. The reason is as follows.

Figure 13:
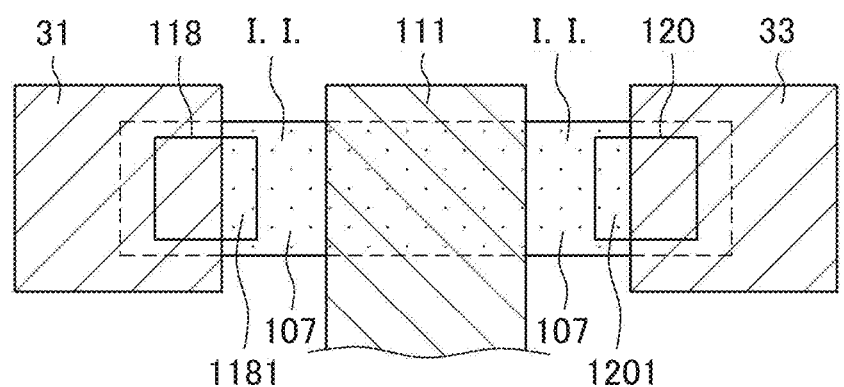
FIG. 13 is a plan view of D portion of FIG. 12B.

FIG. 13 is a plan view corresponding to the region D in FIG. 12B. In FIG. 13, the channel region of the oxide semiconductor 107 is formed under the gate electrode 111. The drain electrode 31 connects with the oxide semiconductor 107 at the through hole 118; the source electrode 33 connects with the oxide semiconductor 107 at the through hole 120. The oxide semiconductor 107 is conductive under the drain electrode 31 and the source electrode 33 because the metals deprive the oxide semiconductor 107 of oxygen.

In oxide semiconductor 107, conductivity is given to the region between the channel and the drain electrode 31, and to the region between the channel and the source electrode 33 by ion implantation (I.I.). Therefore, if an eave exists at the side of the drain electrode 31 or the source electrode 33, there can exist a region which does not get ion implantation. To avoid this problem, the gaps 1181 and 1201 are formed in the through holes 118 and 120 so that eves are not formed by the drain electrode 31 and the source electrode 33 at the sides opposing to the channel.

FIG. 12C is a cross sectional view in which the inorganic passivation film 112 is formed covering the electrodes 31, 111, and 33 for the oxide semiconductor TFT. FIG. 12D is a cross sectional view in which through holes 23, 41, 42, 43, 44, 61, 62, and 63 are formed in the inorganic passivation film 112. FIG. 12E is a cross sectional view in which the connection wrings (also referred to as the conductive materials or the electrodes) 24, 51, 52, 53, 54, 71, 72, and 73 are formed in each of the through holes. Thus, each of the polysilicon semiconductor TFT, the first light shading film 99, the oxide semiconductor TFT, and the second light shading film 105 is able to have an electrical connection.

Embodiment 5

Figure 14A:
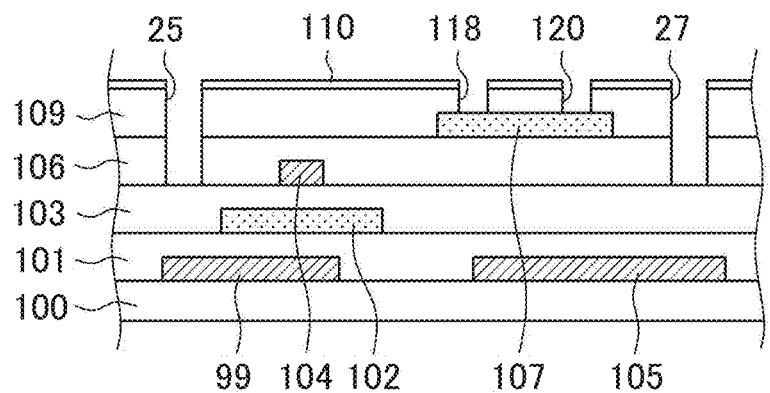
FIG. 14A is a cross sectional view of the structure in the midway process of embodiment 5.
Figure 14B:
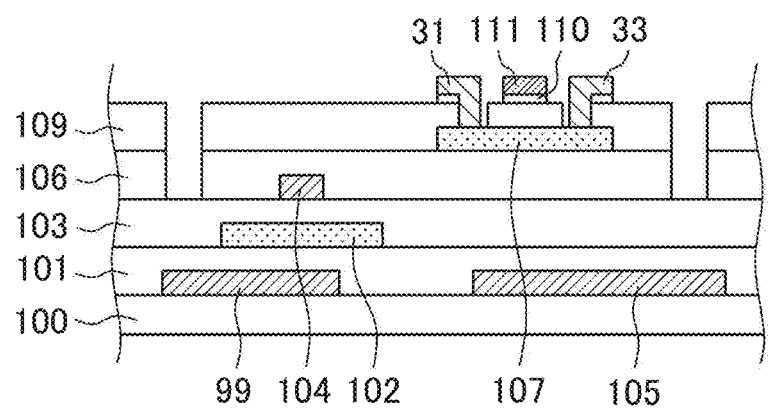
FIG. 14B is a cross sectional view of the structure in the midway process of embodiment 5.
Figure 14C:
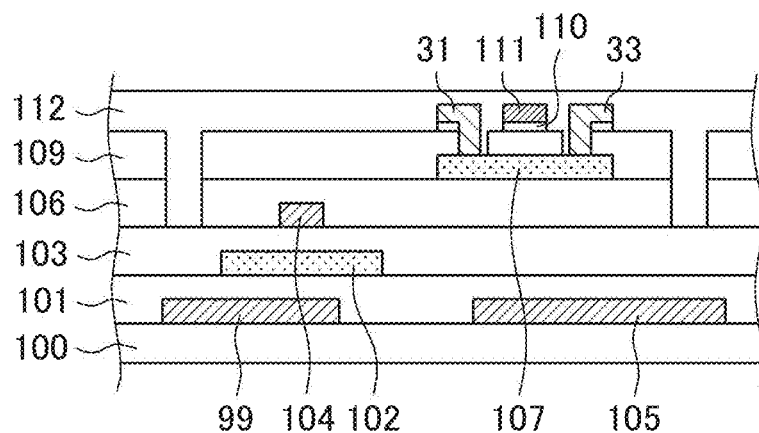
FIG. 14C is a cross sectional view of the structure in the midway process of embodiment 5.
Figure 14D:
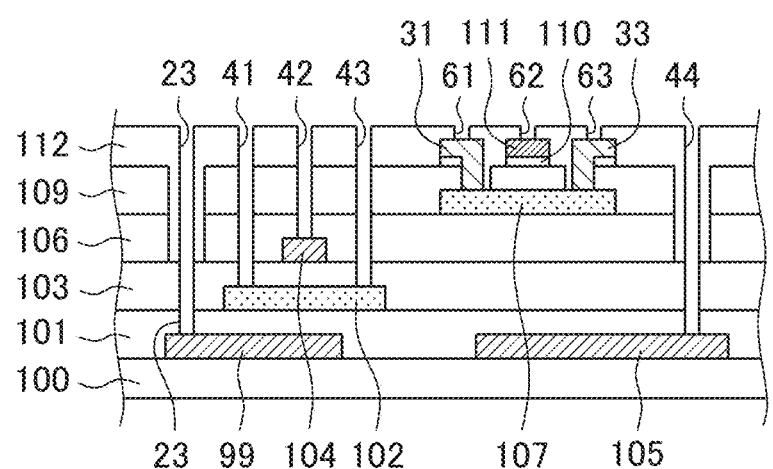
FIG. 14D is a cross sectional view of the structure in the midway process of embodiment 5.
Figure 14E:
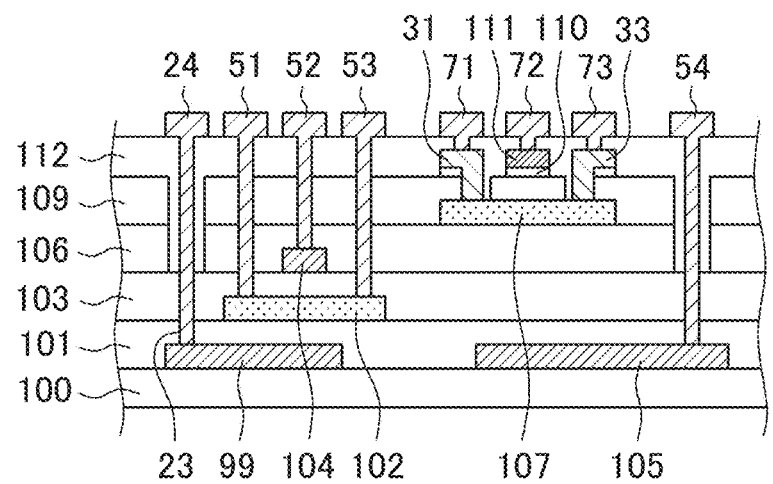
FIG. 14E is a cross sectional view of the representative structure of embodiment 5.

FIG. 14E is a cross sectional view of the structure of embodiment 5 of the present invention; FIGS. 14A through 14D are the cross sectional views in the midway processes to realize the structure of FIG. 14E. The structure of FIG. 14E also has merits, as with embodiment 1, that the contamination to the oxide semiconductor 107 due to the process forming the protecting metal 108 can be avoided and that the number of the processes can be decreased compared with the comparative example. Embodiment 5 also has the same structure as embodiment 4 in that the through holes for the oxide semiconductor TFTs are formed before the through holes for the polysilicon semiconductor TFTs are formed. Embodiment 5 differs from embodiment 4 in that the second light shading film 105 for the oxide semiconductor TFT is formed on the same layer as the first light shading film 99, namely, on the TFT substrate 100.

The structure of FIG. 14A is the same as the structure of FIG. 12A of embodiment 4 except that the second light shading film 105 is formed on the TFT substrate 100, the through hole 27 for the second light shading film 105 is formed in the same layers as the through hole 25 for the first light shading film 99, namely, formed through the interlayer insulating film 106 and the second gate insulating film 109.

FIG. 14B is a cross sectional view in which the drain electrode 31, the gate electrode 111 and the source electrode 33 for the oxide semiconductor TFT are formed. The relation between the drain electrode 31 and the through hole 118 and the relation between the source electrode 33 and the through hole 120 are the same as explained in FIG. 12B and FIG. 13.

FIG. 14C is a cross sectional view in which the inorganic passivation film 112 is formed covering the electrodes 31, 111 and 33 for the oxide semiconductor TFT. FIG. 14D is a cross sectional view in which the through holes 23, 41, 42, 43, 44, 61, 62 and 63 are formed in the inorganic passivation film 112. FIG. 14E is a cross sectional view in which the connection wrings (also referred to as the conductive materials or the electrodes) 24, 51, 52, 53, 54, 71, 72, and 73 are formed in each of the through holes. Thus, each of the polysilicon semiconductor TFT, the first light shading film 99, the oxide semiconductor TFT, and the second light shading film 105 is able to have an electrical connection.

Embodiment 6

Figure 15A:
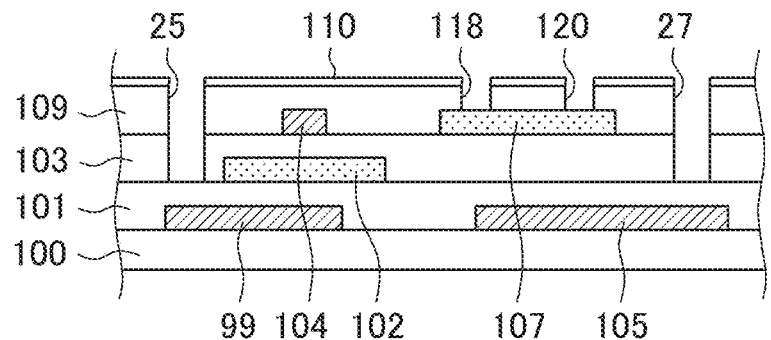
FIG. 15A is a cross sectional view of the structure in the midway process of embodiment 6.
Figure 15B:
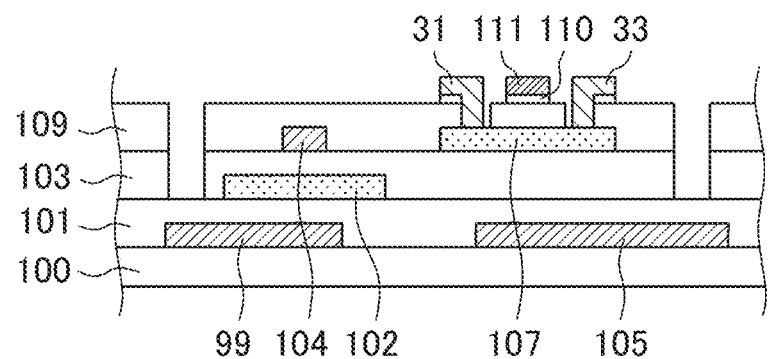
FIG. 15B is a cross sectional view of the structure in the midway process of embodiment 6.
Figure 15C:
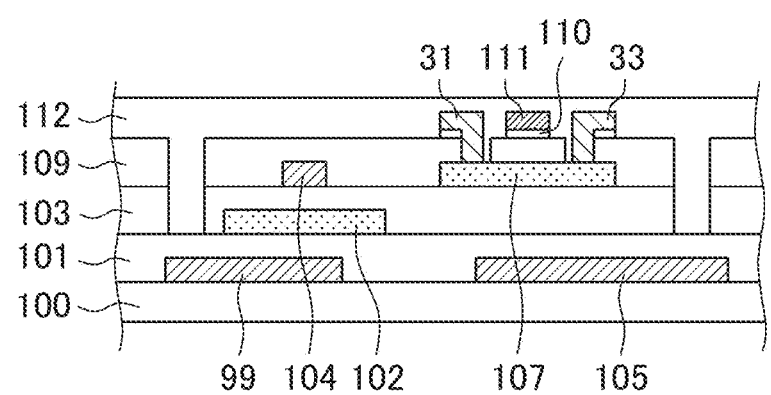
FIG. 15C is a cross sectional view of the structure in the midway process of embodiment 6.
Figure 15D:
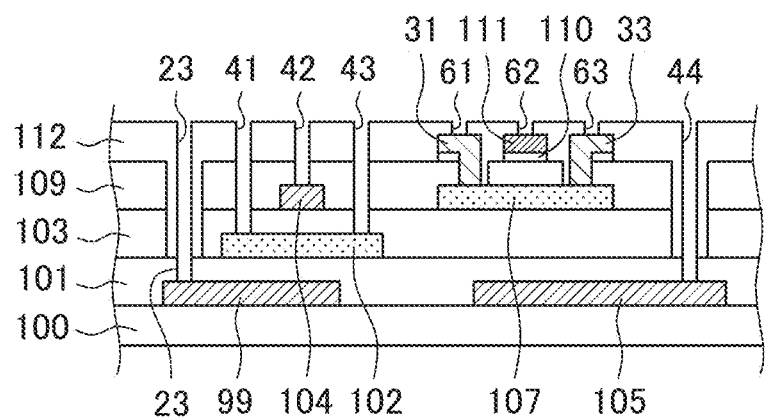
FIG. 15D is a cross sectional view of the structure in the midway process of embodiment 6.
Figure 15E:
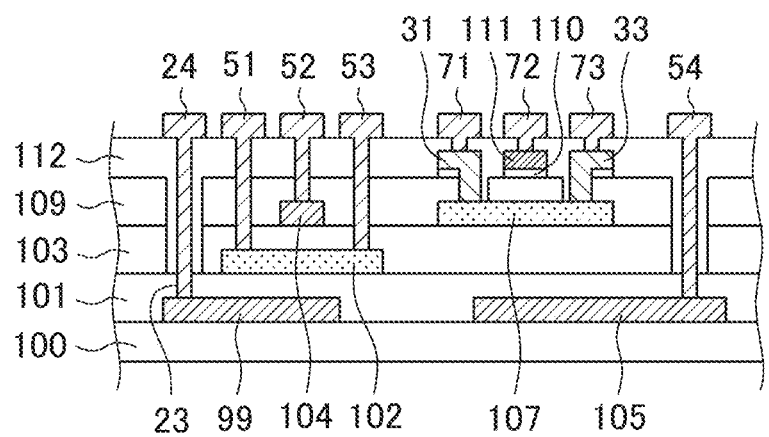
FIG. 15E is a cross sectional view of the representative structure of embodiment 6.

FIG. 15E is a cross sectional view of the structure of embodiment 6 of the present invention; FIGS. 15A through 15D are the cross sectional views in the midway processes to realize the structure of FIG. 15E. The structure of FIG. 15E also has merits, as with embodiment 1, that the contamination to the oxide semiconductor 107 due to the process forming the protecting metal 108 can be avoided and that the number of the processes can be decreased compared with the comparative example. Embodiment 6 also has the same structure as embodiments 4 and 5 in that the through holes for the oxide semiconductor TFTs are formed before the through holes for the polysilicon semiconductor TFTs are formed. Embodiment 6 differs from embodiments 4 and 5 in that the interlayer insulating film 106 is eliminated in FIG. 6. This structure of embodiment 6 is common to the embodiment 3.

In FIG. 15A, the oxide semiconductor 107 is formed on the first gate insulating film 103 as with the gate electrode 104. The through hole 25 and the through hole 27 are formed through the second gate insulating film 109 and the first gate insulating film 103. FIG. 15B is a cross sectional view in which the drain electrode 31, gate electrode 111 and source electrode 33 are formed for the oxide semiconductor TFT. The relation between the drain electrode 31 and the through hole 118 and the relation between the source electrode 33 and the through hole 120 are the same as explained in FIG. 12B and FIG. 13.

FIG. 15C is a cross sectional view in which the inorganic passivation film 112 is formed covering the electrodes 31, 111 and 33 for the oxide semiconductor TFT. FIG. 15D is a cross sectional view in which through holes 23, 41, 42, 43, 44, 61, 62, and 63 are formed in the inorganic passivation film 112. FIG. 15E is a cross sectional view in which the connecting wirings (also referred to as the conductive materials or the electrodes) 24, 51, 52, 53, 54, 71, 72, and 73 are formed in each of the through holes. Thus, each of the polysilicon semiconductor TFT, the first light shading film 99, the oxide semiconductor TFT, and the second light shading film 105 is able to have an electrical connection. In addition to the merit described at the beginning of the present embodiment, the present invention has a merit that the production cost can be further decreased because the interlayer insulating film 106 is eliminated.

Embodiment 7

In embodiments 1 through 6, the present invention has been explained in regard to the liquid crystal display device.

Figure 16:
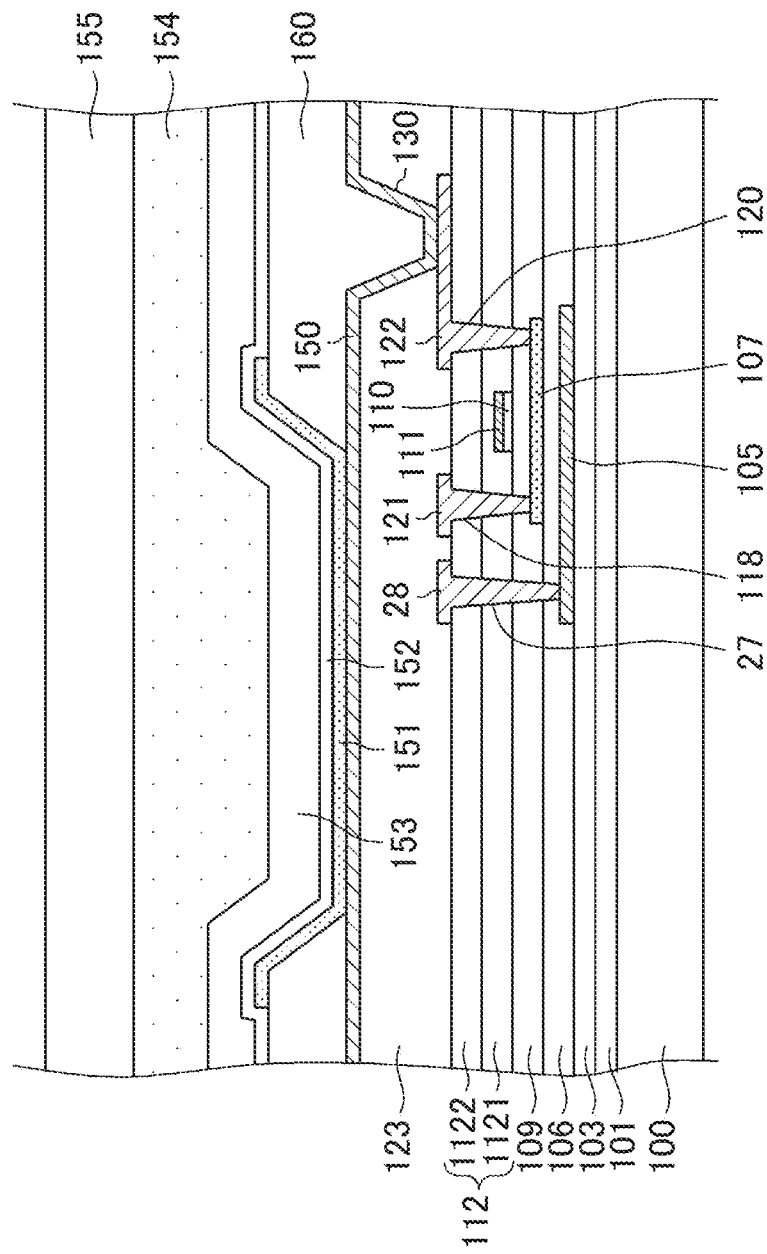
FIG. 16 is a cross sectional view of the display area of the organic EL display device.

This invention, however, can be applied not only to the liquid crystal display device but also to the organic EL display device. FIG. 16 is a cross sectional view of the display area of the organic EL display device. The structure of FIG. 16 is the same as the structure of FIG. 4 of the liquid crystal display device up to: forming the oxide semiconductor TFT, covering the oxide semiconductor TFT by organic passivation film 123 and forming the through hole 130 to connect the oxide semiconductor TFT with the lower electrode 150.

In FIG. 16, the lower electrode 150 as the anode is formed on the organic insulating film 123. The bank 160, which has a hole, is formed on the lower electrode 150. The organic EL layer 151 as the light emitting layer is formed in the hole of the bank 160. The upper electrode 152 is formed as a cathode on the organic EL layer 151. The upper electrode 152 is formed common to each of the pixels. The protective film 153 including the silicon nitride film is formed covering the upper electrode 152. The circularly polarizing plate 155 is attached to the protective film 153 through the adhesive 154 to prevent reflection of the external light.

As shown in FIG. 16, the structure of the organic EL display device is the same as the liquid crystal display device explained in embodiment 1 up to forming the drain electrode 121 and the source electrode 122 for the oxide semiconductor TFT, and forming shield wiring 28 for the second light shading film 105. In addition, the structure of the peripheral circuit including the polysilicon semiconductor TFT can take the structure explained embodiments 1 through 6. Therefore, the present invention is applicable to the organic EL display device.

Embodiment 8

The hybrid structure, in which the oxide semiconductor TFT and the polysilicon semiconductor TFT are formed on the same substrate, can be used not only in display devices but also in semiconductor devices for sensors and so forth. For example, polysilicon semiconductor TFT is used in the driving circuit for the sensor, and the oxide semiconductor TFT can be used to control sensor element in the detecting area.

Figure 17:
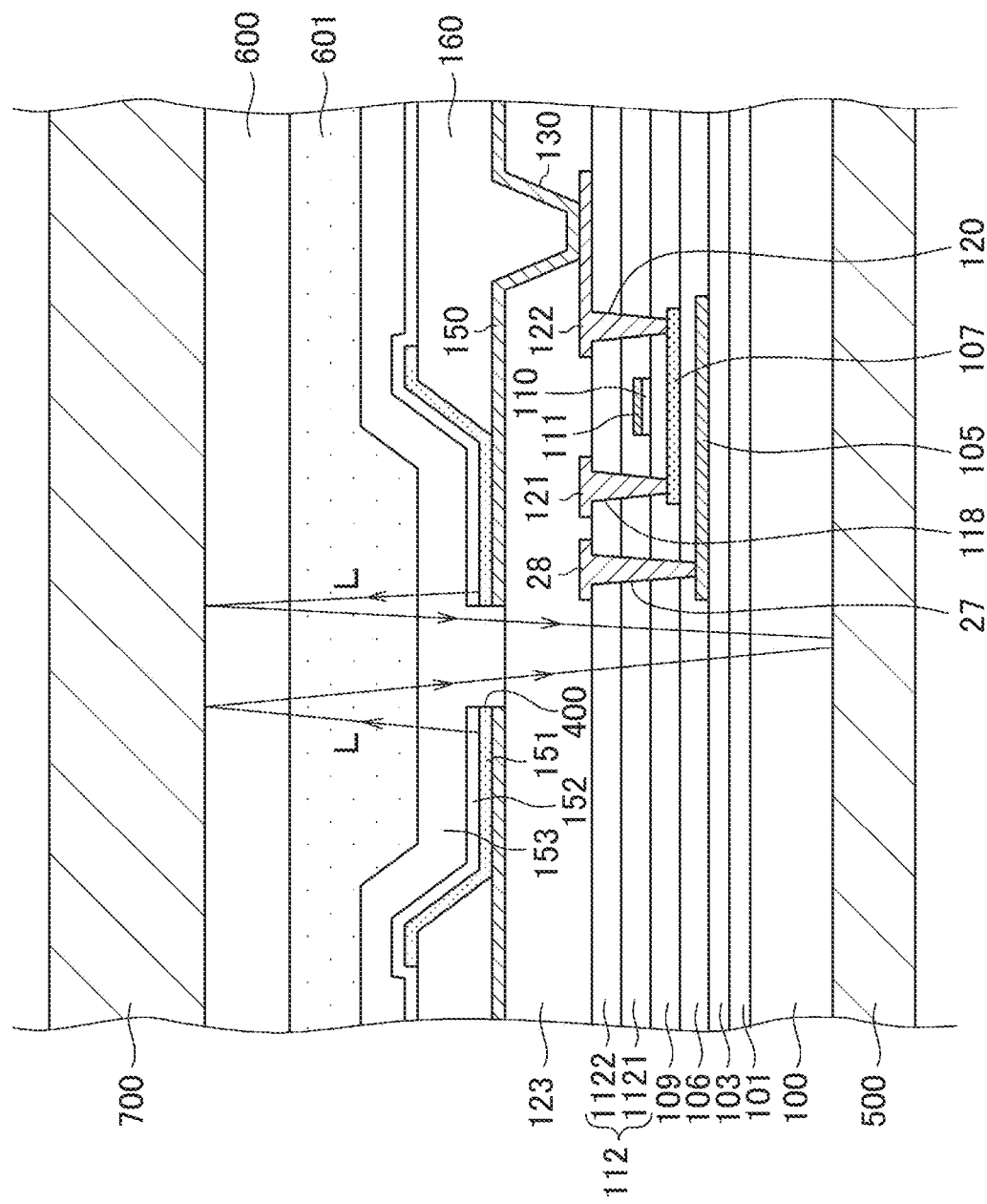
FIG. 17 is a cross sectional view of the detecting area of the photo sensor device.

There are many kinds of sensors. FIG. 17 is an example in which the similar structure as the organic EL display device is used as the photo sensor; namely, the organic EL display device is used as the light emitting element. In FIG. 17, in the display area (light emitting element) of the organic EL display device, which is explained in FIG. 16, the light receiving element 500 is disposed under the TFT substrate 100. The face plate 600, formed from the transparent glass substrate or the transparent resin substrate, is disposed via adhesive 601 over the light emitting element. The object 700 to be measured is set on the face plate 600.

In the light emitting element, the light emitting region is constituted by the organic EL layer 151, lower electrode 150 and upper electrode 152. The window 400, in which the organic EL layer 151, lower electrode 150 and upper electrode 152 do not exist, is formed at the central portion of the light emitting region; the light can pass the window 400. In the meantime, the reflection electrode is formed in the lower layer of the lower electrode 150, thus, the light L emitted from the organic EL layer 151 goes upward.

In FIG. 17, the light emitted from the organic EL layer 151 reflects at the object 700, and goes down through the window 400; the light is received by the light receiving element 500, thus, existence of the object 700 is detected. When the object 700 does not exist, the reflected light does not exist, thus, the current does not flow in the light receiving element 500. Therefore, existence of the object 700 can be detected.

Figure 18:
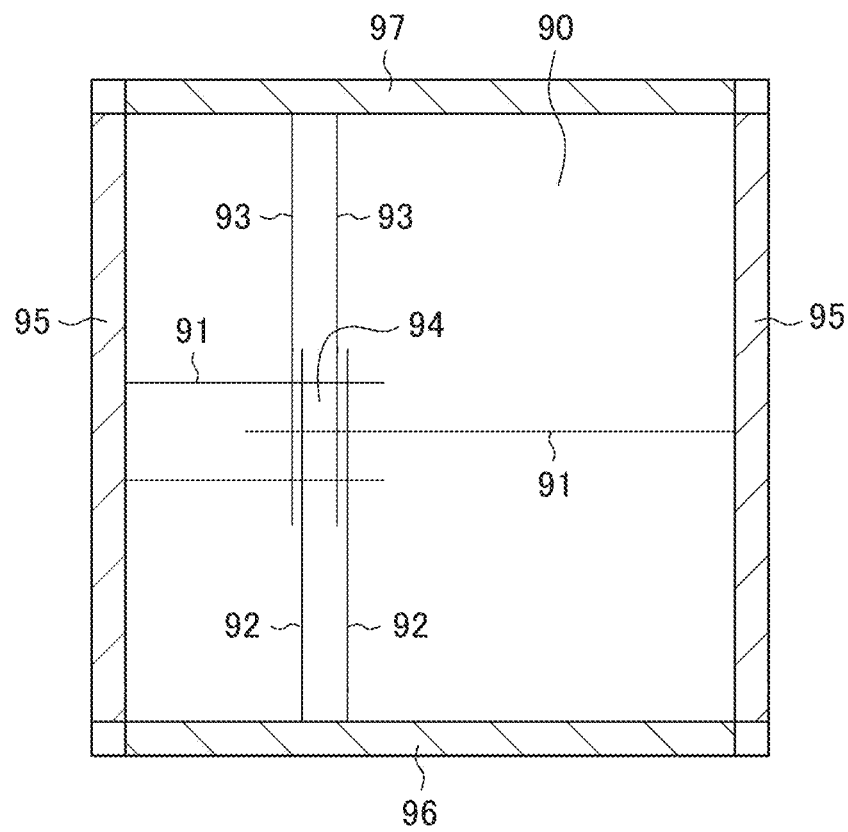
FIG. 18 is a plan view of the photo sensor device.
Figure 18:
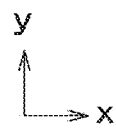

FIG. 18 is a plan view of the photo sensor in which the photo sensor elements shown in FIG. 17 are set in matrix. In FIG. 18, the scan lines 91 extend in lateral direction (x direction) from the scan line driving circuit 95 arranged on each side of the display area 90. The signal lines 92 extend in longitudinal direction (y direction) from the signal line driving circuit 96, which is located at the lower side of the display area 90; the power lines 93 extend in lower direction (−y direction) from the power circuit 97, which is located at the upper side of the display area 90. The sensor element 94 is in an area surrounded by the scan lines 91 and the signal lines 92 or surrounded by the scan lines 91 and the power lines 93.

In FIG. 18, the polysilicon semiconductor TFTs can be used in the scan line driving circuit 95 and in the signal line driving circuit 96 and so forth; the oxide semiconductor TFTs can be used as the switching TFTs in sensor elements 94. Therefore, the hybrid structure explained in embodiments 1 through 6 can be used in such photo sensors.

In the meantime, the photo sensor of the present embodiment can detect two dimensional images by detecting the intensity of the reflection from the object 700, not only the existence of the object 700. Further, color images and spectral images can be detected by sensing for necessary color spectrum. Definition of the sensor is determined by a size of the sensor element 94 in FIG. 18; however, the definition can be controlled by summarizing several sensor elements 94 as one large sensor element.

The similar structure of the organic EL display device is applied to the photo sensor in FIGS. 17 and 18; the present invention, however, can be applied not only to such a photo sensor but also can be applied to other types of the photo sensor. Further, the present invention can be applied not only to the photo sensor but also can be applied to other sensors like capacitance sensors and so forth, which use semiconductor circuit substrates.

In the above embodiments, the present invention has been explained in regard to the structure in which both the oxide semiconductor TFT and the polysilicon semiconductor TFT are used in the substrate. In the embodiments, the polysilicon semiconductor TFT is disposed nearer to the substrate than the oxide semiconductor TFT is; however, the present invention is also applicable to the structure that the oxide semiconductor TFT is disposed nearer to the substrate than the polysilicon semiconductor TFT is.

Further, the present invention is applicable to the structure that only the oxide semiconductor TFT or only the polysilicon semiconductor TFT is formed on the substrate. Namely, in the structure in which the light shading film is disposed for the polysilicon semiconductor TFT or for the oxide semiconductor TFT, the present invention can be applied to realize the structure or the manufacturing method for the through hole that exposes the light shading film to supply the shield voltages to the light shading film.

What is claimed is:

1. A display device comprising:
   a substrate;
   a first thin film transistor, including a polysilicon semiconductor layer, formed on the substrate;
   a second thin film transistor, including an oxide semiconductor layer, formed on the substrate;
   a first light shading film, located between the polysilicon semiconductor layer and the substrate, and opposing to the polysilicon semiconductor layer;
   a second light shading film located between the oxide semiconductor layer and the substrate, and opposing to the oxide semiconductor layer;
   a first insulating film, including at least one first layer, formed on the first light shading film;
   a second insulating film, including at least one second layer, formed on the first insulating film;
   a first through hole, opposing to the first light shading film, penetrating the second insulating film, not penetrating the first insulating film, and including a first upper opening and a first lower opening, the first upper opening being farther from the substrate compared to the first lower opening;
   a second through hole, opposing to the first light shading film, penetrating the first insulating film, and including a second upper opening and a second lower opening, the second upper opening being farther from the substrate compared to the second lower opening and existing in the first lower opening of the first through hole; and
   a first conductive component, formed above the second insulating film, and electrically connecting with the first light shading film via the second through hole,
   wherein
   the first conductive component is in direct contact with the first insulating film,
   at least a part of the first conductive component overlaps with the second insulating film,
   the first insulating film includes a first portion,
   the first portion of the first insulating film does not overlap with the second insulating film in the first through hole,
   the first conductive component includes a second portion, and
   the second portion of the first conductive component overlaps with the first portion of the first insulating film in the first through hole.

2. The display device according to claim 1,
   wherein the second portion of the first conductive component extends in a direction parallel with the substrate.

3. The display device according to claim 1,
   wherein the second portion of the first conductive component includes an upper surface and a lower surface, the upper surface being farther from the substrate compared to the lower surface,
   the lower surface of the second portion of the first conductive component is parallel with the substrate, and
   the upper surface of the second portion of the first conductive component is parallel with the substrate.

4. The display device according to claim 1,
   wherein the second portion of the first conductive component includes an upper surface and a lower surface, the upper surface being farther from the substrate compared to the lower surface,
   a first distance between the lower surface of the second portion of the first conductive component and the substrate is constant, and
   a second distance between the upper surface of the second portion of the first conductive component and the substrate is constant.

5. The display device according to claim 1,
   wherein a first fixed voltage is applied to the first light shading film.

6. The display device according to claim 5,
   wherein a second fixed voltage is applied to the second light shading film.

7. The display device according to claim 5, further comprising:
- a plurality of pixels, each of the plurality of pixels including a pixel electrode and a common electrode that opposes to the pixel electrode,
- a common voltage being applied to the common electrode, and
- the first fixed voltage being the common voltage.

8. The display device according to claim 1,
wherein the second light shading film is formed on a same layer as a first gate electrode of the first thin film transistor.

9. The display device according to claim 8,
wherein the second light shading film and the first gate electrode are formed from a same material.

10. The display device according to claim 1, further comprising:
- a third insulating film, including at least one third layer, formed on the second insulating film,
wherein
- the first through hole does not penetrate the third insulating film,
- the second through hole penetrates the third insulating film,
- the first conductive component is on the third insulating film, and
- the first conductive component is not in direct contact with the second insulating film.

11. The display device according to claim 10,
wherein the first thin film transistor includes a first source electrode and a first drain electrode, both of which connect with the polysilicon semiconductor layer,
- a part of the first source electrode and a part of the first drain electrode exist on the second insulating film and are covered by the third insulating film,
- a third through hole, which penetrates the third insulating film, is formed overlapping one of the part of the first source electrode and the part of the first drain electrode, and
- the one of the part of the first source electrode and the part of the first drain electrode electrically connects with a first connecting wiring through the third through hole, and at least a part of the first connecting wiring exists on the third insulating film.

12. The display device according to claim 11, further comprising:
- an aluminum oxide film formed in direct contact with the second insulating film and between the part of the first source electrode and the second insulating film, and
- the aluminum oxide film is formed in direct contact with the second insulating film and between the part of the first drain electrode and the second insulating film.

13. The display device according to claim 10,
wherein the first thin film transistor includes a first gate electrode,
- the first gate electrode, existing on the second insulating film, electrically connects with a second connecting wiring, which is covered by the third insulating film,
- a fourth through hole, which penetrates the third insulating film, exists overlapping the second connecting wiring, and
- the second connecting wiring electrically connects with a first gate wiring, and at least a part of the first gate wring exists on the third insulating film, through the fourth through hole.

14. The display device according to claim 13, further comprising:
- an aluminum oxide film formed between the second connecting wiring and the second insulating film, in direct contact with the second connecting wiring and the second insulating film.

15. The display device according to claim 14,
wherein the second thin film transistor includes a second gate electrode,
- the second gate electrode is formed on the second insulating film and is covered by the third insulating film,
- a fifth through hole, which penetrates the third insulating film, exists overlapping the second gate electrode, and
- the second gate electrode connects with a second gate wiring through the fifth through hole, and a part of the second gate wiring exists on the third insulating film.

16. The display device according to claim 14,
wherein the first light shading film and the second light shading film exist on a same layer, and further comprising:
- a sixth through hole, which penetrates the second insulating film, and does not penetrate the first insulating film and the third insulating film, is formed opposing to the second light shading film,
- a seventh through hole penetrates the first insulating film and the third insulating film, and a part of the seventh through hole exists in the sixth through hole, and
- the second light shading film electrically connects with a second conductive component through the seventh through hole, and at least a part of the second conductive component exists on the third insulating film.

17. The display device according to claim 16,
wherein the oxide semiconductor layer of the second thin film transistor is formed on a same layer as the first gate electrode.

18. The display device according to claim 14,
wherein a distance between the substrate and the oxide semiconductor layer is larger than a distance between the substrate and the first gate electrode.

19. The display device according to claim 14,
wherein the second thin film transistor includes a second gate electrode, a second drain electrode, a second source electrode, and a second gate insulating film including an eighth through hole and a ninth through hole,
- the oxide semiconductor layer connects with the second drain electrode through the eighth through hole, and connects with the second source electrode through the ninth through hole,
- a side wall of the eighth through hole includes a first region that does not contact the second drain electrode, and
- a side wall of the ninth through hole includes a second region that does not contact the second source electrode.

20. The display device according to claim 19,
wherein the third insulating film exists between the first region and the second drain electrode in the eighth through hole, and
- the third insulating film exists between the second region and the second source electrode in the ninth through hole.

* * * * *